US010151982B2

(12) United States Patent
Fiolka et al.

(10) Patent No.: US 10,151,982 B2
(45) Date of Patent: Dec. 11, 2018

(54) ILLUMINATION SYSTEM OF A MICROLITHOGRAPHIC PROJECTION EXPOSURE APPARATUS WITH A BIREFRINGENT ELEMENT

(71) Applicant: Carl Zeiss SMT GmbH, Oberhocken (DE)

(72) Inventors: Damian Fiolka, Oberkochen (DE); Daniel Walldorf, Frankfurt (DE); Ingo Saenger, Heidenheim (DE)

(73) Assignee: Carl Zeiss SMT GmbH, Oberkochen (DE)

(*) Notice: Subject to any disclaimer, the term of this patent is extended or adjusted under 35 U.S.C. 154(b) by 364 days.

(21) Appl. No.: 15/008,731

(22) Filed: Jan. 28, 2016

(65) Prior Publication Data

US 2016/0195815 A1    Jul. 7, 2016

Related U.S. Application Data

(63) Continuation of application No. 12/717,696, filed on Mar. 4, 2010, now Pat. No. 9,316,920, which is a (Continued)

(30) Foreign Application Priority Data

Sep. 14, 2007  (DE) .................. 10 2007 043 958

(51) Int. Cl.
*G03B 27/72* (2006.01)
*G03F 7/20* (2006.01)

(52) U.S. Cl.
CPC .......... *G03F 7/702* (2013.01); *G03F 7/70116* (2013.01); *G03F 7/70191* (2013.01); *G03F 7/70566* (2013.01); *G03F 7/70966* (2013.01)

(58) Field of Classification Search
CPC ............ G03F 7/70116; G03F 7/70091; G03F 7/70075; G03F 7/702; G03F 7/70141;
(Continued)

(56) References Cited

U.S. PATENT DOCUMENTS 5,502,738 A    3/1996  Hyuga
6,498,869 B1*  12/2002 Yao ...................... G02B 6/2706
                                                        359/494.01
(Continued)

FOREIGN PATENT DOCUMENTS

CN    1690861 A    11/2005
CN    1760763 A    4/2006
(Continued)

OTHER PUBLICATIONS

European Office Action for corresponding Appl No. 08803974.8, dated Jul. 5, 2017.
(Continued)

*Primary Examiner* — Christina A Riddle
(74) *Attorney, Agent, or Firm* — Fish & Richardson P.C.

(57) ABSTRACT

The disclosure concerns an illumination system of a microlithographic projection exposure apparatus. The illumination system includes a mirror arrangement which has a plurality of mirror units and at least one element arranged in front of the mirror arrangement in the light propagation direction to produce at least two different states of polarization incident on different mirror units. The mirror units are displaceable independently of each other for altering an angle distribution of the light reflected by the mirror arrangement.

23 Claims, 24 Drawing Sheets

Related U.S. Application Data continuation of application No. PCT/EP2008/062007, filed on Sep. 10, 2008.

(60) Provisional application No. 60/972,291, filed on Sep. 14, 2007.

(58) Field of Classification Search
CPC ............... G03F 7/7015; G03F 7/70191; G03F 7/70566; G03F 7/70966
USPC ......... 355/52, 53, 55, 67–71, 77; 250/492.1, 250/492.2, 492.22, 548; 430/5, 8, 22, 30, 430/311, 312; 359/489.01, 489.15, 489.2, 359/490.01, 490.03, 494.01
See application file for complete search history.

(56) References Cited

U.S. PATENT DOCUMENTS

| | | | |
|---|---|---|---|
| 6,535,273 B1 | 3/2003 | Maul | |
| 6,636,295 B2 | 10/2003 | Shiozawa | |
| 7,206,060 B2 | 4/2007 | Mori | |
| 7,265,816 B2 | 9/2007 | Tsuji | |
| 7,525,642 B2 | 4/2009 | Mulder et al. | |
| 7,868,909 B2 | 1/2011 | Miyagawa | |
| 2001/0052968 A1* | 12/2001 | Shiozawa | G03F 7/70066 355/53 |
| 2004/0021943 A1* | 2/2004 | Sewell | G02B 1/02 359/489.03 |
| 2004/0218271 A1 | 11/2004 | Hartmaier et al. | |
| 2005/0146704 A1* | 7/2005 | Gruner | G03F 7/70108 355/71 |
| 2005/0280794 A1 | 12/2005 | Tsuji | |
| 2006/0072094 A1 | 4/2006 | Honda | |
| 2006/0077370 A1* | 4/2006 | Mulkens | G02B 5/3091 355/67 |
| 2006/0139612 A1* | 6/2006 | Wagner | G03F 7/70083 355/71 |
| 2006/0158624 A1 | 7/2006 | Toyoda | |
| 2006/0170901 A1 | 8/2006 | Tanitsu et al. | |
| 2006/0203214 A1 | 9/2006 | Shiraishi | |
| 2006/0221453 A1 | 10/2006 | Koehler et al. | |
| 2006/0291057 A1* | 12/2006 | Fiolka | G02B 7/008 359/486.03 |
| 2007/0008511 A1* | 1/2007 | De Boeij | G03F 7/70125 355/71 |
| 2007/0146676 A1* | 6/2007 | Tanitsu | G03F 7/70108 355/71 |
| 2007/0165202 A1 | 7/2007 | Koehler et al. | |
| 2007/0195305 A1* | 8/2007 | Mulder | G03F 7/70116 355/71 |
| 2007/0263199 A1* | 11/2007 | Fiolka | G03F 7/70566 355/71 |
| 2008/0129931 A1 | 6/2008 | Takahashi et al. | |
| 2008/0273185 A1 | 11/2008 | Omura et al. | |
| 2009/0002673 A1* | 1/2009 | Shinoda | G03F 7/70058 355/71 |
| 2009/0174877 A1 | 7/2009 | Mulder et al. | |
| 2009/0262324 A1* | 10/2009 | Patra | G03F 7/70116 355/68 |
| 2010/0165318 A1 | 7/2010 | Fiolka et al. | |
| 2010/0231888 A1* | 9/2010 | Mueller | G02B 1/08 355/71 |

FOREIGN PATENT DOCUMENTS

| | | | |
|---|---|---|---|
| CN | 101025573 A | 8/2007 | |
| EP | 1 610 181 A2 | 12/2005 | |
| EP | 1 647 863 A2 | 4/2006 | |
| EP | 1 693 885 | 8/2006 | |
| EP | 1 826 616 A2 | 8/2007 | |
| JP | 2002-062528 | 2/2002 | |
| JP | 2002-520810 | 7/2002 | |
| JP | 2003-121791 | 4/2003 | |
| JP | 2004-157219 | 6/2004 | |
| JP | 2005-509184 | 4/2005 | |
| JP | 2006-005319 | 1/2006 | |
| JP | 2006-085071 | 3/2006 | |
| JP | 2006-191064 | 7/2006 | |
| JP | 2006-196715 | 7/2006 | |
| JP | 2007-053390 | 3/2007 | |
| JP | 2007-506262 | 3/2007 | |
| JP | 2007-189079 | 7/2007 | |
| JP | 2007-524247 | 8/2007 | |
| JP | 2007-227918 | 9/2007 | |
| KR | 20070087507 | 8/2007 | |
| TW | 484036 B | 4/2002 | |
| WO | WO 2005/026843 | 3/2005 | |
| WO | WO 2005/041277 | 5/2005 | |
| WO | WO 2005083517 A2 * | 9/2005 | G03F 7/70566 |
| WO | WO 2005/124420 | 12/2005 | |
| WO | WO 2006/064693 A1 | 6/2006 | |
| WO | WO 2008061681 A2 * | 5/2008 | G03F 7/70116 |
| WO | WO 08/131928 | 11/2008 | |

OTHER PUBLICATIONS

International Search Report and a Written Opinion from the counterpart PCT Application No. PCT/EP2008/062007, filed Sep. 10, 2008.

International Preliminary Report on Patentability for the corresponding PCT Application No. PCT/EP2008/062007, dated Mar. 16, 2010.

Chinese Office Action, with English translation, for corresponding CN Application No. 200880107193.3, dated Jul. 26, 2011.

Chinese Office Action, with English translation, for corresponding CN Appl No. 200880107193.3, dated Dec. 31, 2011.

Japanese Office Action, with English translation, for corresponding JP Appl No. 2010-524477, dated Feb. 17, 2012.

Japanese Office Action, with translation thereof, for corresponding JP Appl No. 2012-117571 dated Nov. 20, 2013.

Chinese Office-Action, with translation thereof, for CN Appl No. 201210400890.6, dated Aug. 20, 2014.

Korean Office Action, with translation thereof, for KR Appl No. 2014-7001407, dated Apr. 20, 2015.

\* cited by examiner

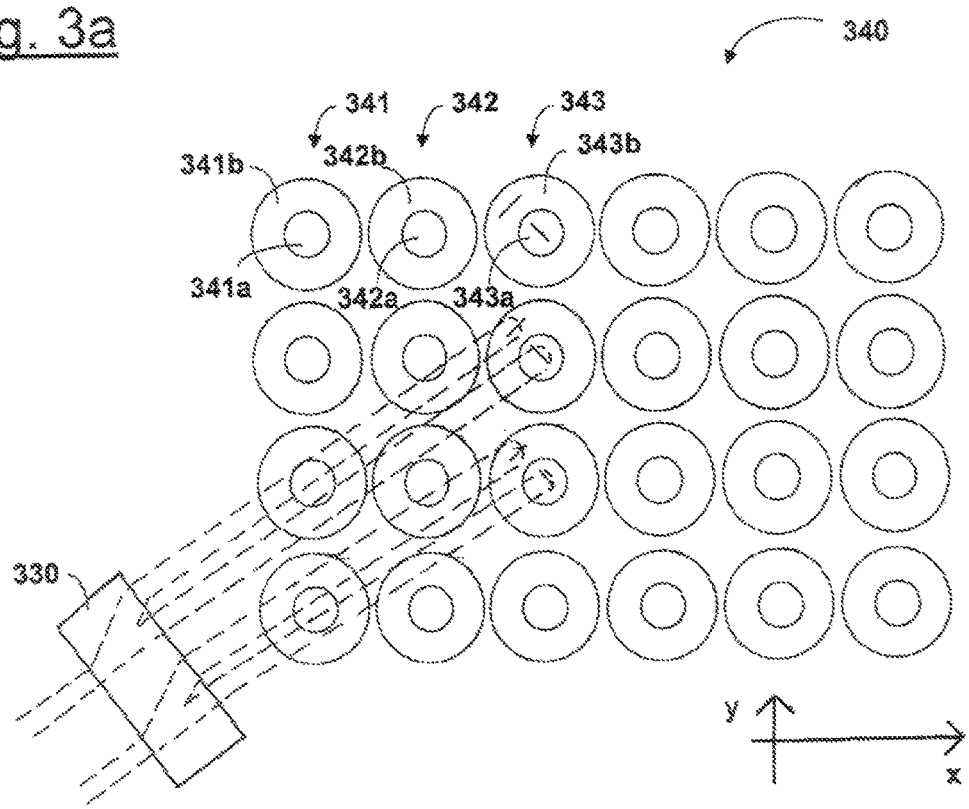
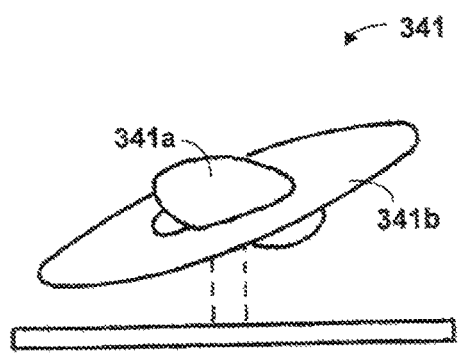

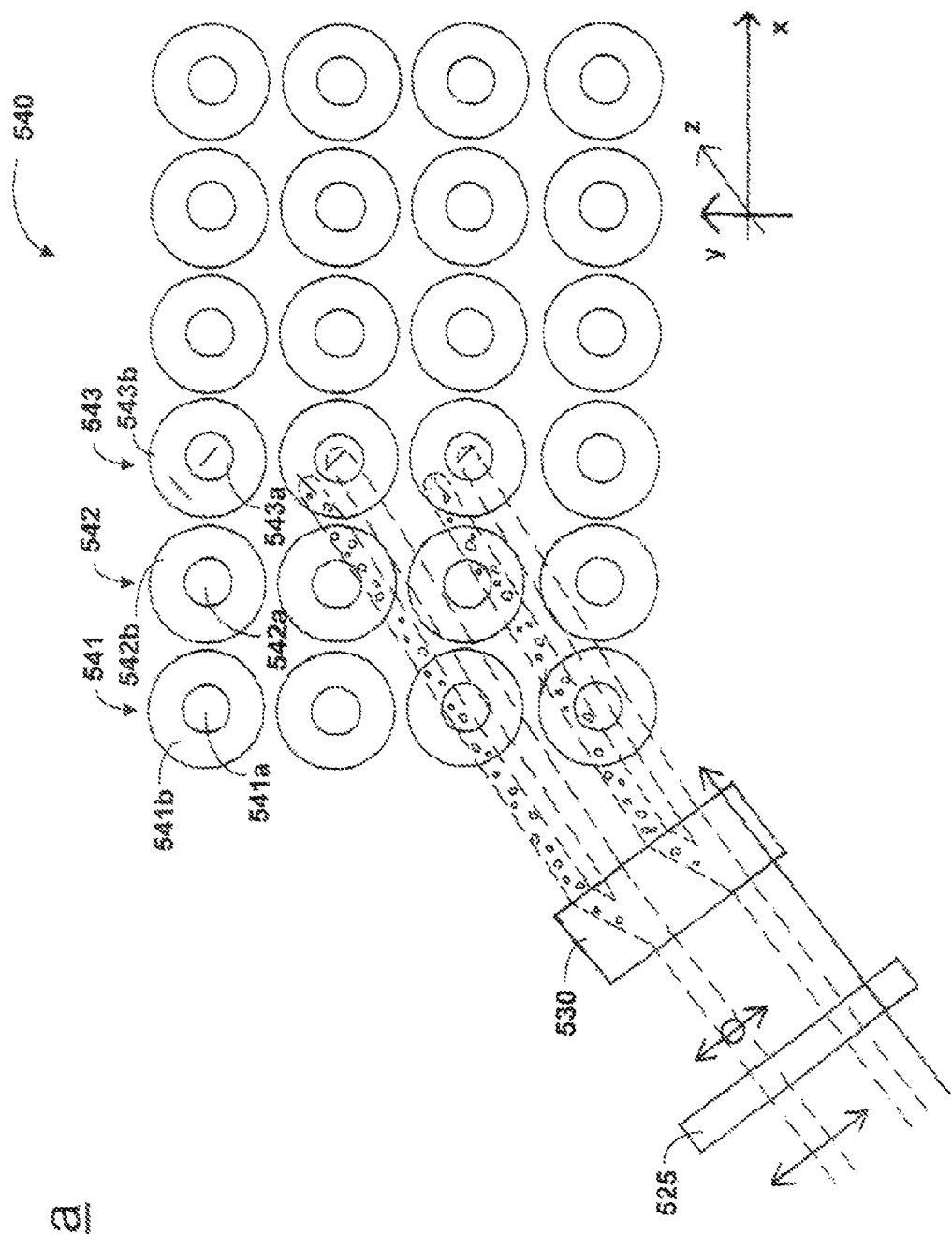

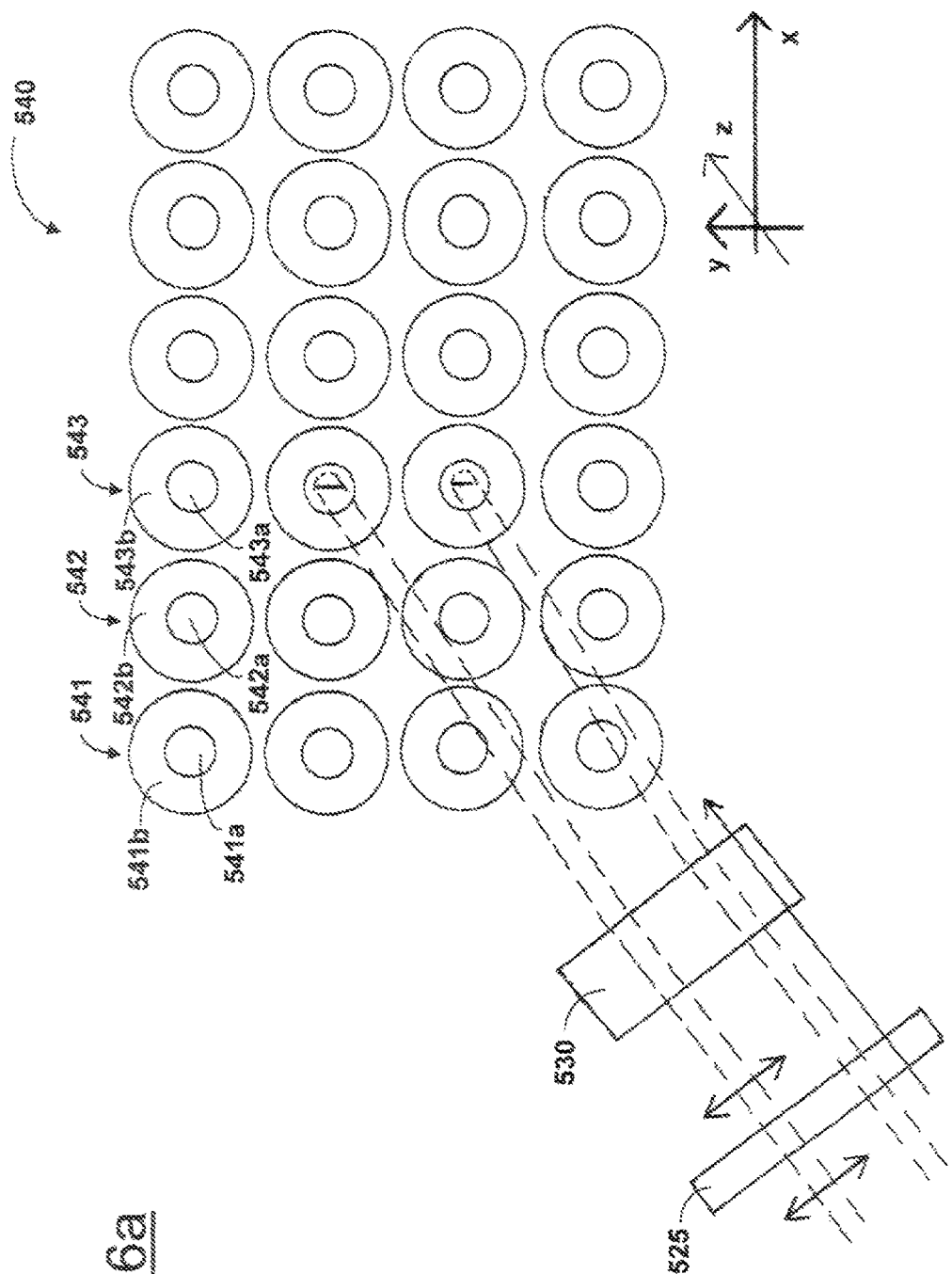

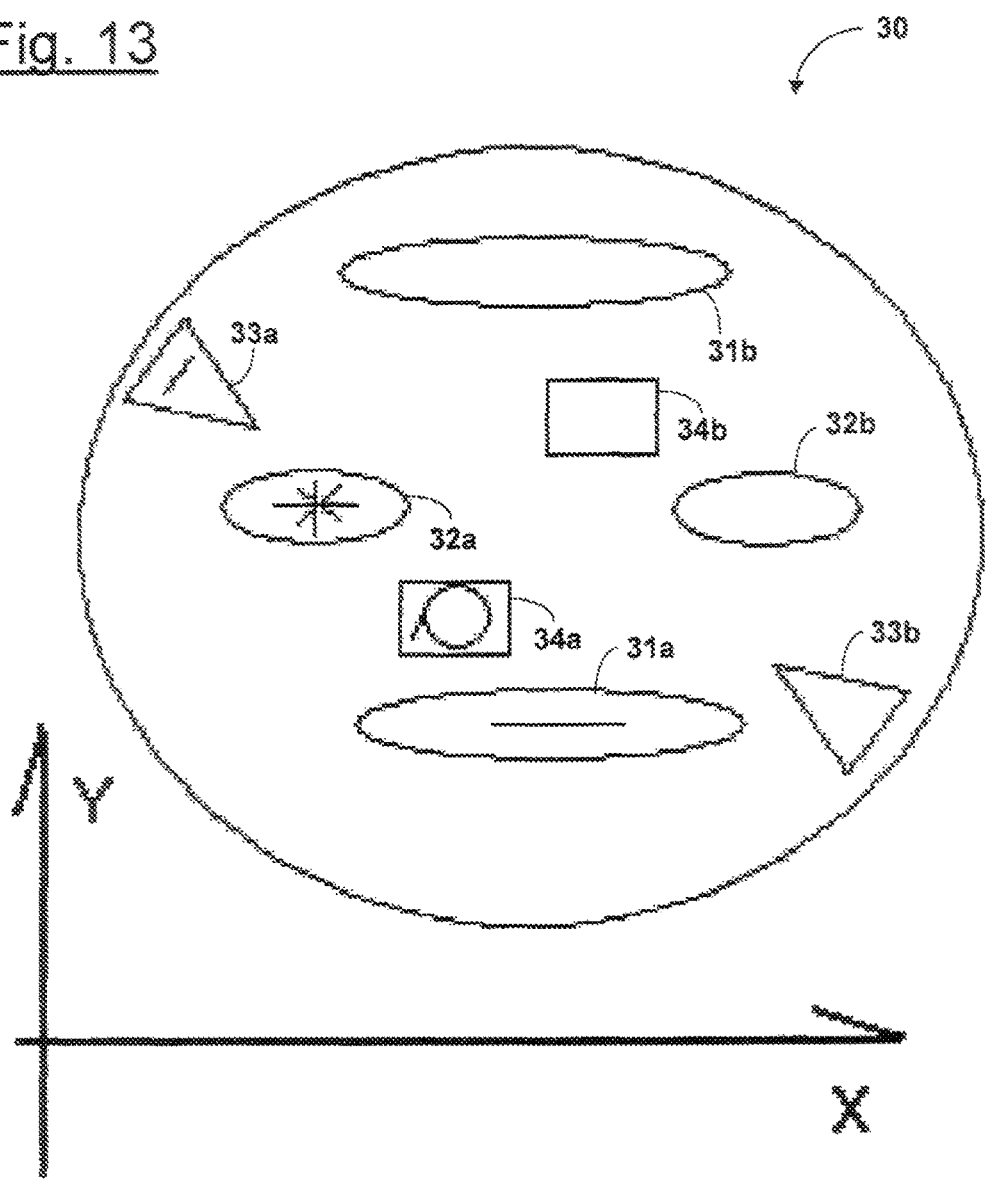

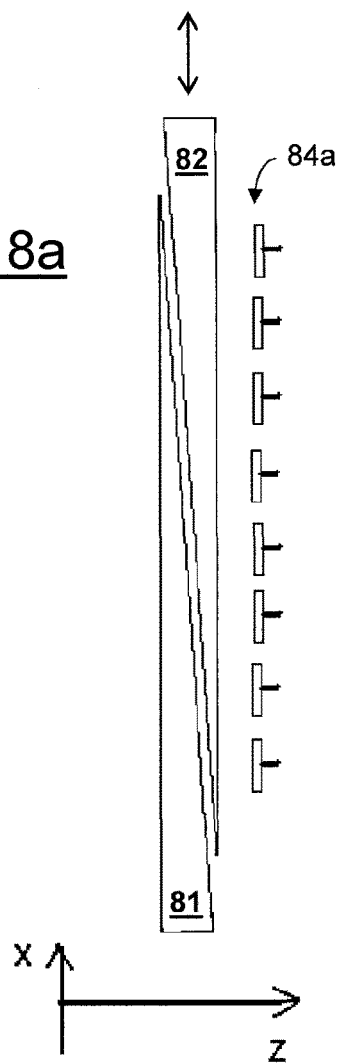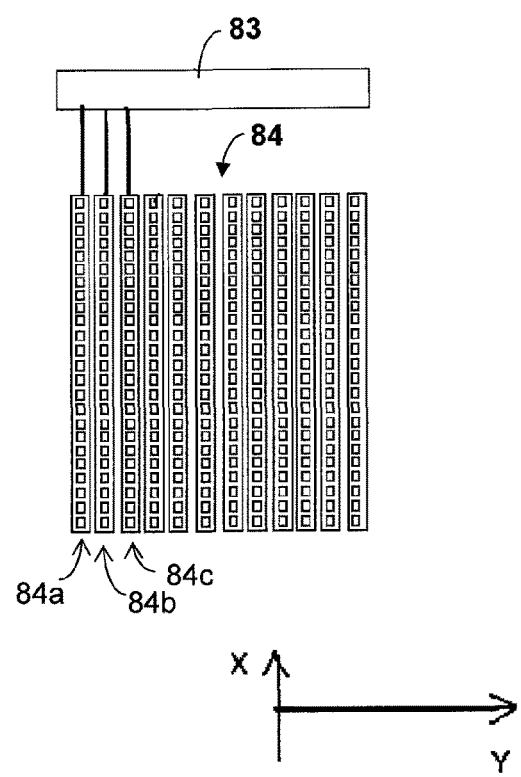

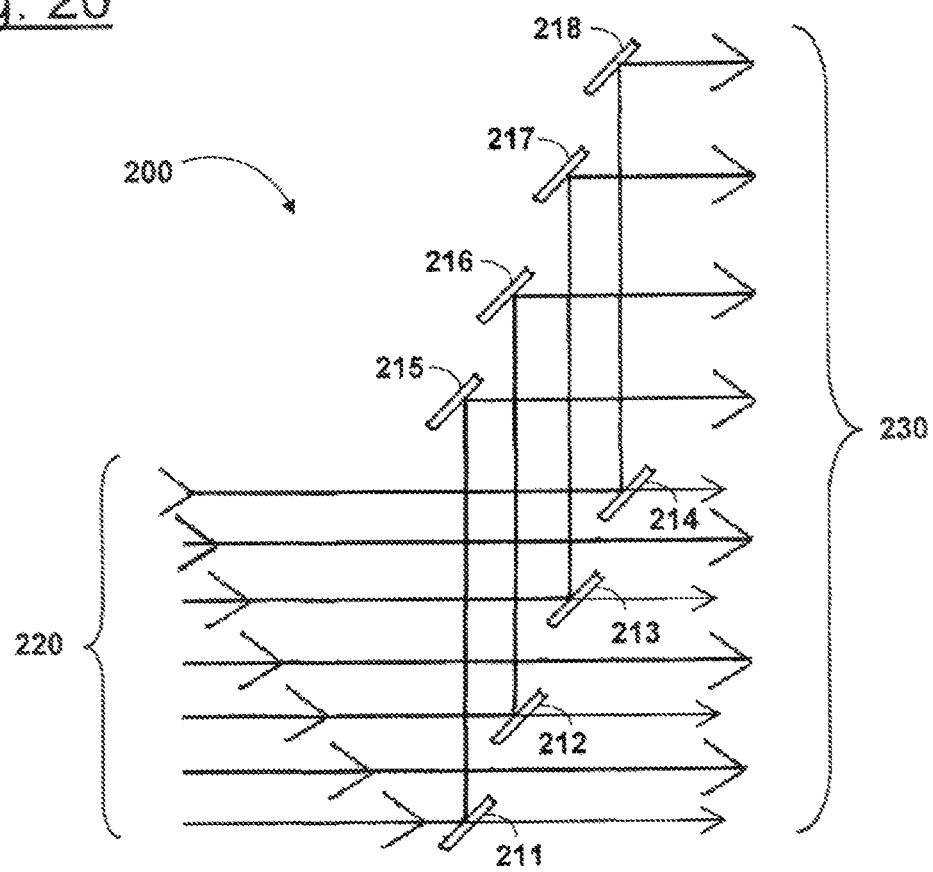
Fig. 20
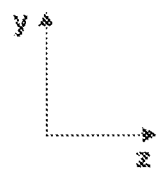

ILLUMINATION SYSTEM OF A MICROLITHOGRAPHIC PROJECTION EXPOSURE APPARATUS WITH A BIREFRINGENT ELEMENT

CROSS-REFERENCE TO RELATED APPLICATIONS

This application is a continuation of, and claims benefit under 35 USC 120 to, U.S. application Ser. No. 12/717,696, filed Mar. 4, 2010, which is a continuation of, and claims benefit under 35 USC 120 to, international application PCT/EP2008/062007, filed Sep. 10, 2008, which claims benefit of German Application No. 10 2007 043 958.1, filed Sep. 14, 2007 and U.S. Ser. No. 60/972,291, filed Sep. 14, 2007. U.S. application Ser. No. 12/717,696 and international application PCT/EP2008/062007 are hereby incorporated by reference in their entirety.

FIELD

The disclosure concerns an illumination system of a microlithographic projection exposure apparatus.

BACKGROUND

Microlithography is used for the production of microstructured components such as for example integrated circuits or LCDs. The microlithography process is carried out in what is referred to as a projection exposure apparatus which has an illumination system and a projection objective. The image of a mask illuminated via the illumination system (=reticle) is projected in that case via the projection objective onto a substrate (for example a silicon wafer) which is coated with a light-sensitive layer (photoresist) and arranged in the image plane of the projection objective in order to transfer the mask structure onto the light-sensitive coating on the substrate.

In the illumination system, for specific and targeted adjustment of defined illumination settings, that is to say intensity distributions in a pupil plane of the illumination system, besides the use of diffractive optical elements (referred to as DOEs), it is also known to use mirror arrangements, for example as disclosed in WO 2005/026843 A2. Such mirror arrangements include a multiplicity of micromirrors which are adjustable independently of each other and which can each be individually tilted in an angle range of for example typically between −10° and +10°. A given tilting arrangement in respect of the mirrors makes it possible to form a desired light distribution (for example a dipole setting, a quadrupole setting or an annular illumination setting) in the pupil plane, by the previously homogenized and collimated laser light being deflected in the appropriate direction, depending on the respectively desired illumination setting. A corresponding structure is diagrammatically shown in FIG. 22 illustrating a partial region of an illumination system which in the beam path of a laser beam 10 successively includes a deflection mirror 11, a refractive optical element (ROE) 12, a lens 13 (only shown by way of example), a microlens arrangement 14, a mirror arrangement 15, a diffuser 16, a lens 17 and a pupil plane PP. The mirror arrangement 15 includes a multiplicity of micromirrors and the microlens arrangement 14 has a multiplicity of microlenses for specific focusing onto those micromirrors.

When using a DOE, the entire pupil plane can be "spread out" from each point of the laser beam profile by diffraction at the diffractive structures of the DOE, and thus a substantially uniform illumination of the pupil plane can achieved irrespective of the intensity distribution in the laser beam profile. When using a mirror arrangement, variations in the laser beam profile can lead to energy fluctuations in the pupil plane, if, for example, polarization states which are different from each other are set in individual poles of a dipole illumination setting, utilizing different regions of the laser beam profile.

Accordingly, when using a mirror arrangement, for specific targeted adjustment of defined illumination settings, a change in the laser beam profile can undesirably result in non-homogenous illumination of the pupil plane.

SUMMARY

In some embodiments, the disclosure provides an illumination system of a microlithographic projection exposure apparatus, which permits flexible adjustment of defined illumination settings, while reducing the interference influences of non-homogeneities in the laser beam profile.

In certain embodiments, an illumination system of a microlithographic projection exposure apparatus includes:
  a mirror arrangement which has a plurality of mirror units, the mirror units being displaceable independently of each other for altering an angle distribution of the light reflected by the mirror arrangement, and
  at least one element arranged in front of the mirror arrangement in the light propagation direction for producing at least two different states of polarization incident on different mirror units.

Due to the combination of the mirror arrangement with the at least one element for producing at least two different states of polarization, it is possible to illuminate different, for example, mutually adjacent mirror units or elements of the mirror arrangement with different polarization states and to e.g. achieve a dense succession of mutually alternating polarization orientations. Light with one of different (e.g. two mutually perpendicular) polarization directions can be deflected into the pupil plane from each location of the laser beam profile by suitable setting of the individual mirror units or elements. As a result, different locations of the pupil plane can be illuminated with light of a respectively desired polarization state from different positions within the beam profile. In particular, as basically, for example, two mutually perpendicular polarization directions can be deflected at any point in the pupil plane from any point of the entire beam profile, a high degree of beam homogenization can be achieved for a desired illumination setting with a given polarization distribution.

In certain embodiments, at least one element is a birefringent element. It is in particular possible to use the known property of birefringent materials in terms of spatial separation between an ordinary and an extraordinary ray in order to be able to illuminate mutually adjacent mirror units or elements of a mirror arrangement with different polarization states and to achieve a dense succession of mutually alternating polarization orientations.

As a result, it possible to achieve a comparatively dense polarization distribution over the beam profile, wherein in particular different polarization states can be set between respectively adjacent mirror units. The polarization distribution can thus be adjusted over the entire beam profile, with a relatively high level of positional resolution.

In some embodiments, the birefringent element is adapted to the mirror arrangement in such a way that an ordinary ray produced by splitting of a light beam and an extraordinary ray produced by splitting the same light beam can be deflected in different directions via the mirror arrangement.

In certain embodiments, at least some mirror units of the mirror arrangement are composed of an inner mirror element and an outer mirror element therearound. In that respect, optionally, at least one mirror element and the outer mirror element belonging to the same mirror unit as the inner mirror element are displaceable independently of each other. In that way, to achieve a desired illumination setting, the individual mirror units in question can be adjusted differently in respect of the relative setting of the inner mirror element and the outer mirror element. In that respect in particular the birefringent element can be adapted to the mirror arrangement in such a way that an ordinary ray produced by splitting a light beam and an extraordinary ray produced by splitting the same light beam are incident on different mirror units or different mirror elements. In addition, the birefringent element can be adapted to the mirror arrangement in such a way that an ordinary ray produced by splitting a light beam and an extraordinary ray produced by splitting the same light beam are incident on mutually adjacent mirror units or on mirror elements of the same mirror unit.

In certain embodiments, the mirror arrangement has first mirror units and second mirror units, wherein the first mirror units are optimized for a first polarization direction and wherein the second mirror units are optimized for a second polarization direction perpendicular to the first polarization direction. For that purpose the first mirror units and the second mirror units have in particular mutually different coatings.

In some embodiments, the illumination device further has a microlens arrangement with a plurality of microlenses, wherein the element is arranged between that microlens arrangement and the mirror arrangement.

In certain embodiments, a rotator element for rotation of the polarization state (in particular a lambda/2-plate) is arranged upstream of the element in the light propagation direction. Furthermore the lambda/2-plate can be arranged rotatably about the optical axis of the illumination system. Rotation of the lambda/2-plate provides that the polarization direction upstream of the birefringent element and thus the intensity relationship of the ray portions produced in accordance with the disclosure by the birefringent element (that is to say the ordinary and the extraordinary ray portions) can be suitably adjusted.

In some embodiments, the element is made from an optically uniaxial crystal material, in particular magnesium fluoride ($MgF_2$). In certain embodiments, the material from which the birefringent element is produced is a material which is not optically active.

In some embodiments, the element has an optical crystal axis which is not oriented in parallel relationship with the optical axis of the illumination system. In particular, the orientations of the optical crystal axis of the optically uniaxial crystal material and the optical axis of the illumination system can differ from each other by at least ±3°.

In certain embodiments, a rotator element for rotation of the polarization state (in particular a lambda/2-plate) is arranged downstream of the element in the light propagation direction. Via that lambda/2-plate, it is possible to effect setting of a desired orientation of the mutually perpendicular polarization directions of ordinary and extraordinary rays produced via the birefringent element.

In certain embodiments, the illumination system has an arrangement of at least two channels associated with respectively different regions of the mirror arrangement, wherein for those channels the polarization state of the light emanating from the respective channel and incident on the mirror arrangement is adjustable independently of each other. In that way, the respectively set polarization directions can be selected differently in the individual channels and the number of the degrees of freedom or the flexibility of the arrangement according to the disclosure can be further enhanced. The channels can in particular each have at least one respective lambda/2-plate, wherein lambda/2-plates of different channels are adjustable independently of each other. At least one of the lambda/2-plates can be arranged rotatably about the optical axis of the illumination system.

In some embodiments, a lambda/4-plate is arranged between the element and the mirror arrangement. Optionally, the lambda/4-plate is arranged rotatably about an optical axis of the illumination system. In that way left and right circularly polarized light, or also any elliptically polarized light, can be produced at adjacent mirror units or inner mirror elements, in particular circular mirrors, wherein for example an ellipticity of the polarization state, which occurs elsewhere in the illumination system, can be preserved or subsequently compensated without light loss.

In certain embodiments, the element involves planeparallel geometry. In some embodiments, the element can also be in the form of a prism.

In certain embodiments, the illumination system has a polarizer for refreshing the polarization state. Via such a polarizer, it is possible to set, upstream of the arrangement according to the disclosure, a well-defined polarization state, with light components of unwanted polarization state being coupled out, wherein for example effects which occur in the beam feed unit and which lead to imperfect polarization of the laser light can be taken into consideration.

In some embodiments, the element includes at least one retarder that produces, for light passing therethrough, an effective retardation which is less than one half of an operation wavelength of the illumination system. In such embodiments, it is possible to compensate for retardations that are produced by the optical components of the illumination system (in particular lenses or mirrors) and which typically vary across the pupil plane or the field (or reticle) plane, respectively, and/or for a compensation of birefringence introduced in the system by the reticle (mask).

In some embodiments, the position of the at least one retarder can be varied in a plane perpendicular to the light propagation direction. With the flexibility regarding the position of the retarder obtained thereby, it is possible to adjust the number and position of those mirror units that are "covered" by the at least one retarder in a flexible manner and thereby adjust or modify the polarization distribution obtained in the pupil plane. Furthermore, the polarization performance can even be modified dynamically during operation of the illumination system or during the scanning process, respectively.

The element may in particular include at least two retarders that produce, for light passing therethrough, an effective retardation which is less than one half of an operation wavelength of the illumination system. In some embodiments, these retarder produce, for light passing therethrough, effective retardations of opposite sign. The use of two retarders or retardation plates having retardations of opposite sign is advantageous in so far as it allows for an effective compensation in illumination systems where regions of opposite retardation in the pupil plane are produced by the optical components of the illumination system, since light having the appropriate retardations after passing the first or second retardation plates just needs to be directed to the appropriate region in the pupil plane.

In certain embodiments, the disclosure provides an illumination system of a microlithographic projection exposure apparatus. The illumination system includes:

a mirror arrangement which has a plurality of mirror units, the mirror units being displaceable independently of each other for altering an angle distribution of the light reflected by the mirror arrangement, and at least one birefringent element arranged in front of the mirror arrangement in the light propagation direction.

In some embodiments, the disclosure provides an illumination system of a microlithographic projection exposure apparatus. The illumination system is configured such that at least one illumination setting can be set in the illumination system in which at least two regions that are mutually separated from each other are produced in a pupil plane of the illumination system. An area ratio between the regions has a value of at least 3 (e.g., at least 4, at least 5).

In this aspect, the disclosure is based on the consideration that there are operation conditions in which illumination settings are involved that substantially differ from conventional settings such as well known dipole- or quadrupole-settings. Such operation conditions may particularly exist if the design of the reticle or mask is not made in perfect correspondence to the desired structure to be produced on the wafer, but is willfully and by design modified by taking into consideration the illumination- or imaging-properties of the illumination system or the projection objective. Such an approach is also referred to as "design for manufacturing" (DFM), and involves providing the mask with additional or modified structures being selected such that the desired imaging result is obtained on the wafer in consideration of e.g. diffraction effects or the like occurring in the optical system. Since in such situation not only modified designs of the mask, but also modified or adapted illumination settings are involved, which may in particular involve illuminated regions having a size or area which is significantly smaller than the maximum contiguous regions, the illumination settings according the above aspect of the disclosure can be advantageous in such situations and lead to an improved result of the microlithographic process.

In certain embodiments, each of the at least two regions belongs to a pair of regions, wherein the regions of each pair of regions are arranged in point symmetrical relationship with respect to the pupil center.

In some embodiments, the regions of at least one pair of regions the polarization states are either identical or orthogonal with respect to each other.

Furthermore, it is possible to modify, in particular during the scan process, the intensity and/or polarization distribution in the pupil making use of the mirror arrangement. In particular for the described illumination settings, the polarization can be varied or modified, along the scan direction, in the pupil or in the above-mentioned pairs of regions, respectively.

In some embodiments, the regions of at least one pair of regions have a non-circular shape.

In certain embodiments, the disclosure concerns a mirror arrangement, in particular for use in an illumination system, that include:

a plurality of mirror units, wherein the mirror units are displaceable independently of each other for altering an angle distribution of the light reflected by the mirror arrangement, wherein at least some mirror units of the mirror arrangement are composed of an inner mirror element and an outer mirror element thereround.

The disclosure further concerns a microlithographic projection exposure apparatus, a process for the microlithographic production of microstructured components and a microstructured component.

Further configurations of the disclosure are to be found in the description and the appendant claims.

The disclosure is described in greater detail hereinafter by exemplary embodiments by way of example illustrated in the accompanying drawings.

BRIEF DESCRIPTION OF THE DRAWINGS

In the drawings:

FIG. 3a shows a diagrammatic view to describe an arrangement according to the disclosure in a first exemplary embodiment, FIG. 3b shows a view on an enlarged scale of a mirror unit provided in the arrangement of FIG. 3a, FIG. 4 shows a diagrammatic view of a mirror arrangement for fanning out or resolving the laser beam in accordance with an exemplary embodiment of the disclosure, FIGS. 5a-5b, 6a-6c, 7a-7b, 8-12a-12b show diagrammatic views of further exemplary embodiments of the disclosure, FIG. 13 shows a schematic illustration to explain exemplary embodiments of an illumination setting being realized according to a further aspect of the present disclosure, FIGS. 18a-18b-19 show further embodiments of the disclosure involving different sub-elements being movable with respect to each other, FIGS. 20-21 shows diagrammatic views of further exemplary embodiments of the disclosure.

DETAILED DESCRIPTION

Figure 1:
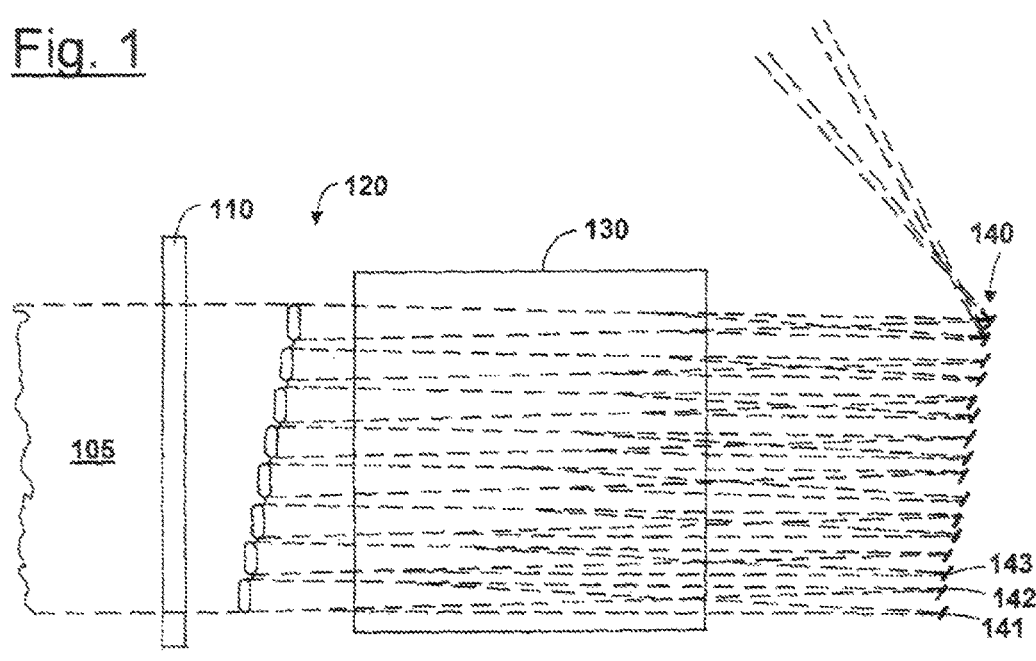
FIG. 1 shows a diagrammatic view to describe the general concept of the present disclosure.

FIG. 1 is a diagrammatic view showing an arrangement to describe the general concept of the present disclosure. In this arrangement a linearly polarized laser beam 105 successively passes through a polarization manipulation unit 110, a microlens arrangement 120 and a birefringent element 130. Disposed downstream of the birefringent element 130 in the light propagation direction is a mirror arrangement 140 including a multiplicity of mirror units 141, 142, 143, . . . which are arranged in mutually adjacent paired relationship inclinedly with respect to the light propagation direction.

The polarization manipulator unit 110 serves to set a desired (global) polarization direction and can be for example in the form of a lambda/2-plate which can be produced from a suitable birefringent material, for example magnesium fluoride ($MgF_2$).

The microlens arrangement 120 serves to achieve specific targeted focusing on the mirror elements 141, 142, 143, . . . of the mirror unit 140 and to reduce or avoid illumination of a "dead area". In addition the microlens arrangement 120 can also provide for homogenization of the laser beam 105 so that, even with a smaller number of mirror elements 141, 142, 143, . . . , it is possible to reduce troublesome influences of a possibly non-homogenous laser beam profile.

Figure 2A:
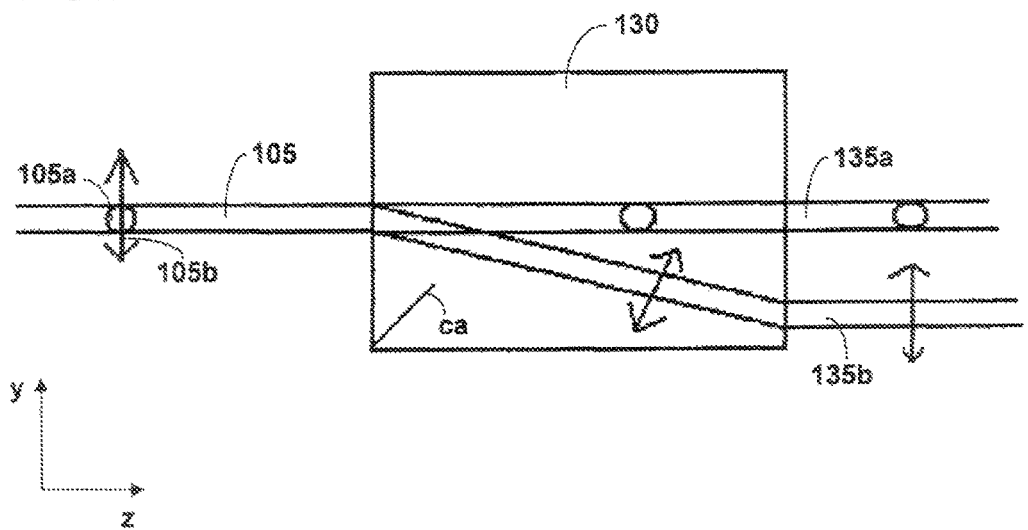
FIGS. 2a-2b show diagrammatic views on an enlarged scale to describe the action of a birefringent element provided in the arrangement according to the disclosure of FIG. 1.

The birefringent element 130 can be made from an optically uniaxial crystal material which is not optically active. A suitable material is for example magnesium fluoride ($MgF_2$). Further optically uniaxial crystal materials which can be used are for example sapphire ($Al_2O_3$) or lanthanum fluoride ($LaF_3$). In that respect, as shown in FIG. 2a, the direction of the optical crystal axis ca extends at an angle of substantially 45° (for example 45°±3°) relative to the direction of incidence of the laser beam 105. In accordance with further embodiments it is also possible to set other angles between the optical crystal axis ca and the direction of incidence of the laser beam 105. The desired spatial separation between the ordinary and the extraordinary rays is at a maximum for the illustrated orientation at an angle of 45°, but all angles between 0° and 90° are also possible. In the arrangement in FIG. 2a that spatial separation disappears if the optical crystal axis extends either perpendicularly or parallel to the direction of incidence of the laser beam 105 or parallel or perpendicularly to the entrance surface of the birefringent element 130.

Figure 2B:
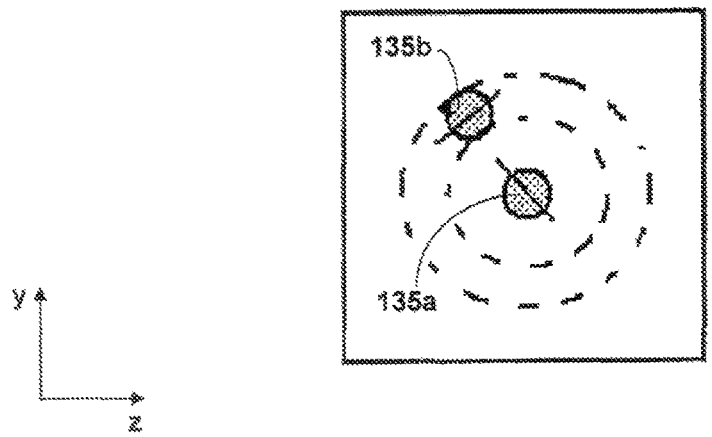

As can best be seen from the views on an enlarged scale in FIGS. 2a and 2b, a partial ray of the laser beam 105, downstream of the birefringent element 130, involves splitting into two partial rays 135a and 135b which are polarized in mutually parallel relationship, wherein in FIG. 2a the partial ray 135a is polarized in the x-direction and the partial ray 135b is polarized in the y-direction perpendicular thereto.

As can best be seen from FIG. 2b, upon rotation of the birefringent element 130, it is possible to adjust different pairs of mutually perpendicular polarization directions. While the ordinary partial ray 135a remains fixed in space upon rotation of the birefringent element 130 and is only rotated in respect of its polarization direction, the extraordinary partial ray 135b moves on a circular path extending around the ordinary partial ray 135a upon rotation of the birefringent element 130, in which case the polarization direction of the extraordinary partial ray 135b always extends perpendicularly to that of the ordinary partial ray 135a, that is to say tangentially to the above-mentioned circular path.

The thickness of the birefringent element 130 can be adapted to the periodicity of the mirror arrangement 140 in such a way that an ordinary ray produced by splitting up a laser beam and an extraordinary ray produced by splitting up the same laser beam can be deflected into different directions via the mirror arrangement 140. In that case the following relationship can apply:

$$\alpha * d = P \quad (1)$$

wherein $\alpha$ denotes the (material-dependent) splitting angle between the ordinary and the extraordinary rays, d denotes the thickness of the birefringent element 130 in the light propagation direction and P denotes the period length of the mirror arrangement 140.

Just by way of example a total number of 4,000 mirror units or elements can be disposed on a square area measuring 50*50 $mm^2$ so that this gives a number of about 63 adjacent mirror units with a period (here corresponding to the spacing of two adjacent mirror units) of P≈0.8 mm. If, in production of the birefringent element 130 of magnesium fluoride ($MgF_2$), the angle $\alpha$ between the ordinary and the extraordinary ray is assumed in terms of its order of magnitude to be about 10 mrad, a thickness d of the birefringent element 130 of d≈(0.8 mm/0.01 rad)=80 mm follows from foregoing equation (1). Typical thicknesses d of the birefringent element 130 are therefore approximately in the range of between 0 and 100 mm. In that respect it follows generally from equation (1) that, the greater the birefringence of the birefringent element 130, the correspondingly less is the selected thickness d for the birefringent element 130.

An exemplary configuration of the mirror arrangement is described hereinafter with reference to FIGS. 3a and 3b.

FIG. 3a is again a diagrammatic view showing the beam splitting effect produced by the birefringent element 330 as well as the illumination of separate mirror units 341, 342, 343, . . . of a mirror arrangement 340. Here each of the mirror units 341, 342, 343, . . . respectively has an inner circular mirror 341a, 342a, 343a, . . . and an outer ring mirror 341b, 342b, 343b, . . . surrounding same, which are displaceable independently of each other by tilting about a common center of the respective mirror unit, both in the x-direction and also in the y-direction. To produce a desired illumination setting, the individual mirror units 341, 342, 343, . . . can be set differently therefore in respect of the relative setting of the inner circular mirror 341a, 342a, 343a, . . . and the outer ring mirror 341b, 342b, 343b, . . . , both in the x-direction and also in the y-direction.

In general terms each of the mirror units can be made up of an inner mirror element and an outer mirror element therearound, wherein the inner mirror element and/or the outer mirror element could also be of shapes differing from the circular or ring shape (for example square or rectangular).

In that respect it is to be noted that, in the embodiment of FIG. 3, the plane of the birefringent element 330 and the plane of the mirror arrangement 340 are actually in mutually parallel relationship (and also parallel to the x-y-plane) and are arranged perpendicularly to the light propagation direction extending in the z-direction. The illustration of the birefringent element 330 in the bottom left region of FIG. 3a is only selected here in order better to show the beam splitting effect and the illumination of separate mirror units. The two rays which are shown in FIG. 3a and which are incident on the birefringent element 330 originate similarly to FIG. 1 from different microlenses, in which case in the embodiment of FIG. 3a a microlens of the microlens arrangement which is not shown in FIG. 3a but which is provided similarly to FIG. 1 is associated with each mirror unit 341, 342, 343, . . . of the mirror arrangement 340. The microlens arrangement and the mirror arrangement 340 are so oriented that, without the presence of the birefringent element, only the inner circular mirrors 341a, 342a, 343a, . . . of the individual mirror units 341, 342, 343, . . . are illuminated. The beam-splitting action of the birefringent element 330 provides for a doubling of the number of partial rays so that additional illumination of the outer ring mirrors 341b, 342b, 343b, . . . is afforded by the additional (extraordinary) partial rays.

Similarly to the foregoing description of FIGS. 2a-b, any mutually perpendicular polarization directions can be set in respect of the beams reflected by the mirror arrangement 340, by rotation of the birefringent element 330 into a suitable position. While the ordinary ray remains on the inner circular mirror 341a, 342a, 343a, . . . upon rotation of the birefringent element 330 and is rotated in respect of its polarization direction upon rotation of the birefringent element 330, the extraordinary ray moves on the respective outer ring mirror 341b, 342b, 343b, . . . upon rotation of the birefringent element 330, in which case its polarization direction always extends perpendicularly to that of the ordinary ray, that is to say always tangentially to the circular path.

Optionally, both in the embodiment of FIG. 3 and also in the embodiments hereinafter, it may be appropriate to avoid a fixed phase relationship between those rays which are deflected by the mirror arrangement onto the same respective location in the pupil plane, in order to prevent troublesome superpositioning effects. That can be achieved by deflecting onto the same location in the pupil plane those respective rays whose polarization state was admittedly adjusted as described hereinbefore but which comes from different mirror units of the mirror arrangement and which are incoherent as a consequence of the spatial coherence condition of the laser light being exceeded.

Figure 4:
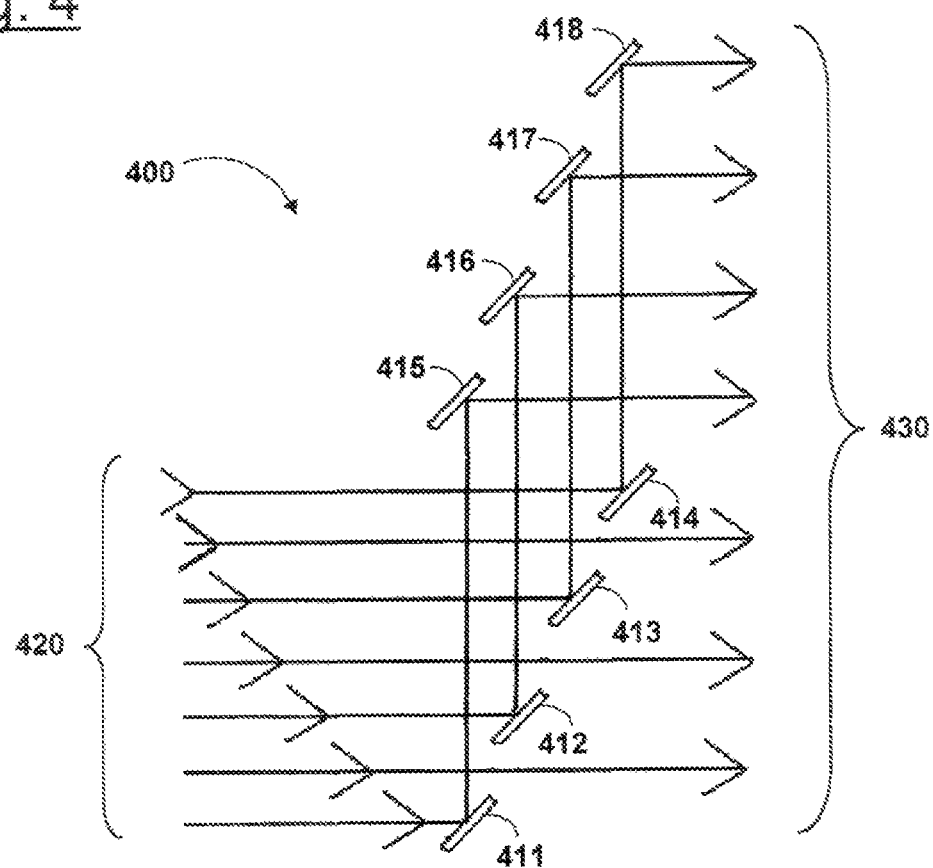

FIG. 4 diagrammatically shows a mirror arrangement 400 which can be used optionally upstream of the birefringent element 130 in the light propagation direction to provide for fanning-out of the light beam and produces beam resolution of the laser beam without introducing beam divergence. The mirror arrangement 400 has a plurality of first mirrors 411-414 and associated second mirrors 415-418 which in turn reflect the light beams deflected by the first mirrors 411-414 through an angle of 90° to the optical axis into the original direction parallel to the optical axis. Beam resolution can be effected only in the y-direction, only in the x-direction or also in the x-direction and in the y-direction, in which case a respective resolution raster of partial rays is produced, in which regions with light and regions without light are produced over the beam profile, without altering the light conductance value.

Referring now again to FIGS. 2a and 2b the intensity ratio of the partial rays 135a and 135b produced in accordance with the disclosure by the birefringent element 130 is dependent on the ratio of the mutually perpendicular polarization components at the beam entrance into the birefringent element 130. Those components of the beam, prior to passing into the birefringent element 130 are identified by 105a and 105b respectively in FIG. 2a. The intensity ratio of the two partial rays 135a and 135b downstream of the birefringent element 130 can consequently be quantitatively regulated by an additional rotator element arranged upstream of the birefringent element 130 in the light propagation direction for rotation of the polarization state. If that rotator element for example rotates light originally polarized (that is to say upstream of the rotator element) linearly in the y-direction through 45° with respect to the polarization direction, polarized components of equal intensity are present both in the x-direction and also in the y-direction downstream of the rotator element and before passing into the birefringent element 130 so that the levels of intensity of the two partial rays 135a and 135b are equal downstream of the birefringent element 130.

Figure 5B:
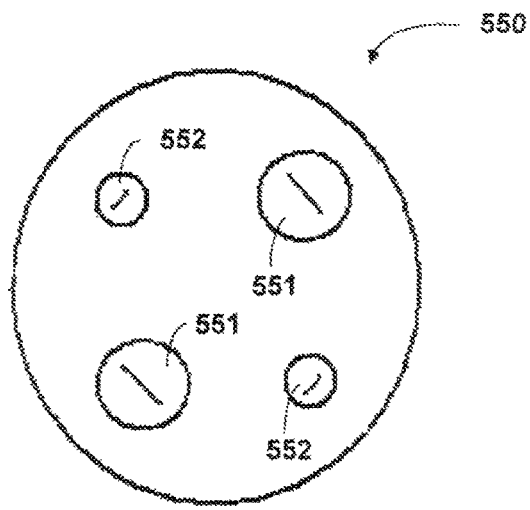

FIG. 5 shows how the intensity ratio of the light components provided by the arrangement according to the disclosure, with mutually perpendicular polarization directions, can be quantitatively regulated. In this case FIG. 5b shows an illumination setting 550 by way of example, in which the light involves the same polarization direction in two first, mutually equal poles 551 whereas the light involves the polarization direction perpendicular thereto in two second poles 552 which are smaller in comparison with the first poles 551. As the poles 551 and 552 are illuminated by the same respective number of mirror elements, for the situation where the rays contributing to the poles 551 and 552 are respectively of the same intensity, the intensity for the second poles 552 would be higher than for the first poles 551. To prevent that and to provide equal illumination of the first poles 551 and the second poles 552 the energy of the light in the respective polarization direction, as shown in FIG. 5a, can be quantitatively regulated with an additional element 525 with which the light components are already adjusted upstream of the birefringent element 530 in respect of their intensity, in accordance with the areas of the poles 551, 552, that are to be later illuminated. The element 525 can be in particular in the form of a lambda/2-plate (for example of magnesium fluoride ($MgF_2$)). By rotation of that lambda/2-plate the polarization direction can be suitably adjusted, upstream of the birefringent element 530. In accordance with a further embodiment the element 525 can also be made from crystalline quartz ($SiO_2$) as the lambda/2-plate, as a consequence of orientation of the optical crystal axis perpendicularly to the light propagation direction or the optical system axis, is so oriented that the optical activity which is basically present in relation to crystalline quartz does not have a disturbing influence.

In particular the ratio of the intensities on a respective pair of inner circular mirror and outer ring mirror involving mutually perpendicular polarization directions can be adjusted via the element 525 for the purposes of homogenous illumination of poles of different size in the pupil plane in such a way that it corresponds to the ratio of the areas of the poles of different sizes. FIG. 5a diagrammatically shows the implementation of that principle insofar as the extraordinary rays from the birefringent element 530, which serve to produce the smaller poles 552 shown in FIG. 5b and which should thus be of a lower level of intensity than the ordinary rays for homogenous illumination of the poles 551, 552, are illustrated by a pattern of holes.

Figure 6B:
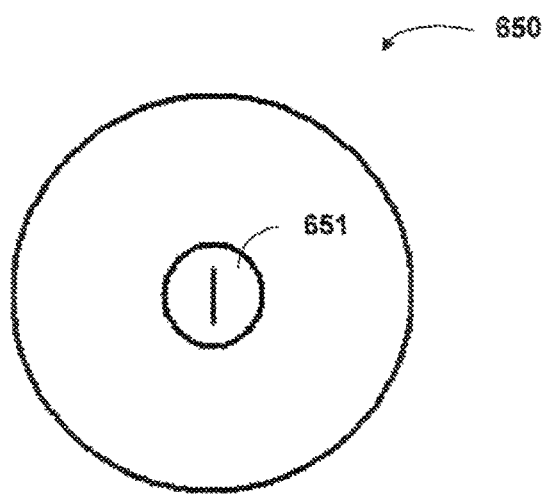

In addition in an extreme case adjustment can also be effected in such a way that only the ordinary ray or also only the extraordinary ray is produced by the element 525. FIG. 6a shows the specific case in which only the ordinary ray is produced by the birefringent element 530, therefore only the inner circular mirrors 541a, 542a, 543a, . . . of the mirror arrangement 540 are illuminated so that the illumination setting shown in FIG. 6b is produced.

Figure 6C:
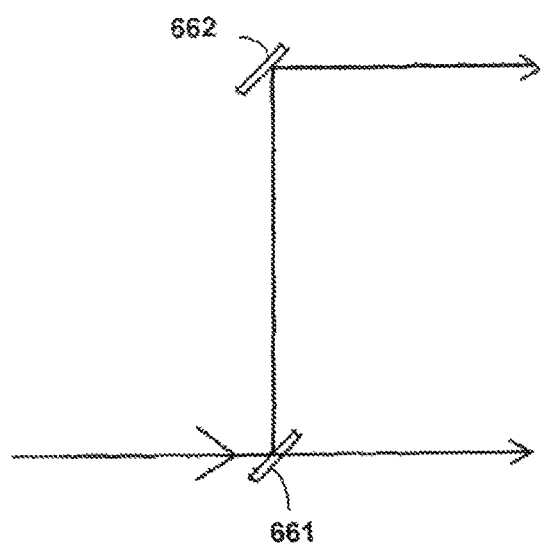

In order in a modification of the embodiment of FIG. 6a to illuminate not just the inner circular mirrors 541a, 542a, 543a, . . . of the mirror arrangement 540 and thus to leave the outer ring mirrors 541b, 542b, 543b, . . . of the mirror arrangement 540 unused, it is also possible to arrange downstream of the birefringent element 530 for example in the light propagation direction, an additional element (not shown) which provides for fanning out the beam, which is polarization-maintaining and which can include for example an arrangement of beam splitters, which provides that, for each mirror unit, the inner circular mirror and the outer ring mirror are respectively illuminated with light of the same polarization state. A suitable arrangement for that purpose is for example a mirror arrangement which with polarization maintenance doubles the number of beams and includes pairs, diagrammatically shown in FIG. 6c, of semitransparent first mirrors 661 respectively arranged at 45° relative to the light propagation direction and associated substantially completely reflecting second mirrors 662, wherein the second mirrors 662 reflect back into the original direction which is parallel to the optical axis, the light beams which are reflected at the first mirrors 661 and which are deflected through an angle of 90° relative to the optical axis.

Figure 7A:
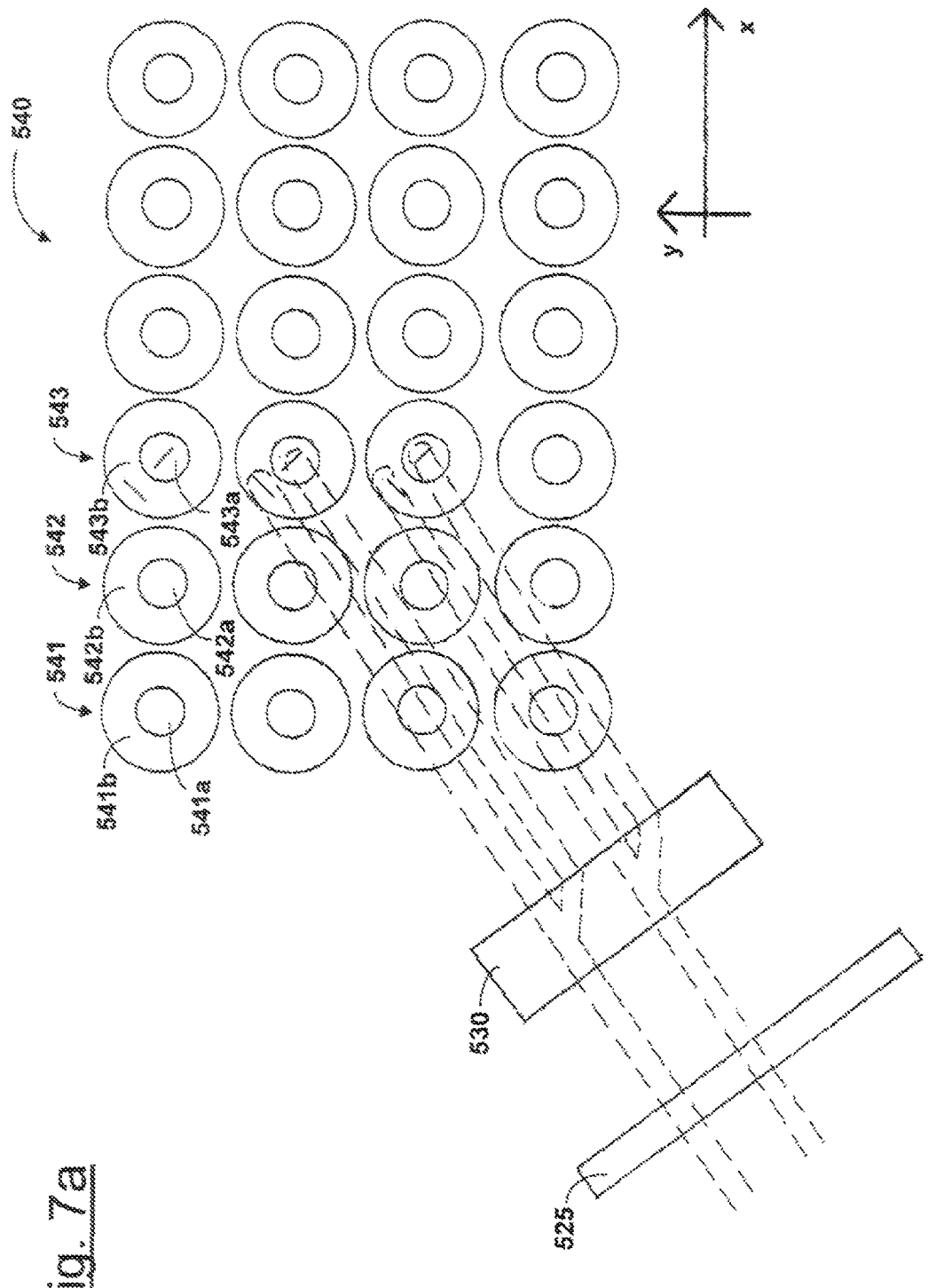
Figure 7B:
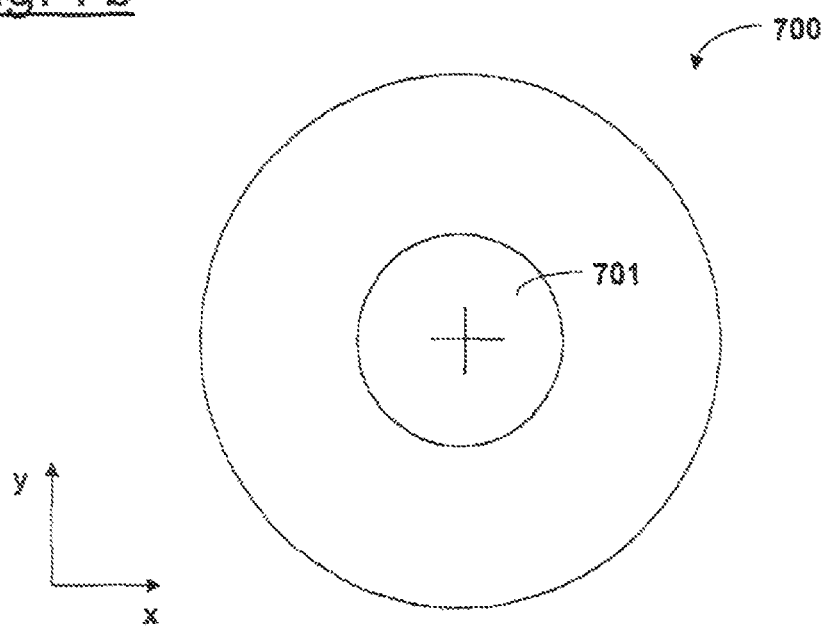

Referring to FIGS. 7*a* and 7*b*, via a suitable adjustment of the element 525, it is also possible for the levels of intensity of the ordinary and the extraordinary rays to be set to be equal and in addition an identical region 701 in the pupil plane can be illuminated by the inner circular mirrors 541*a*, 542*a*, 543*a*, . . . and the outer ring mirrors 541*b*, 542*b*, 543*b*, . . . of the mirror arrangement 540 in order to produce an illumination setting 700 with unpolarized light in the region 701 of the pupil plane by incoherent superpositioning of mutually orthogonal polarization states.

Figure 8:
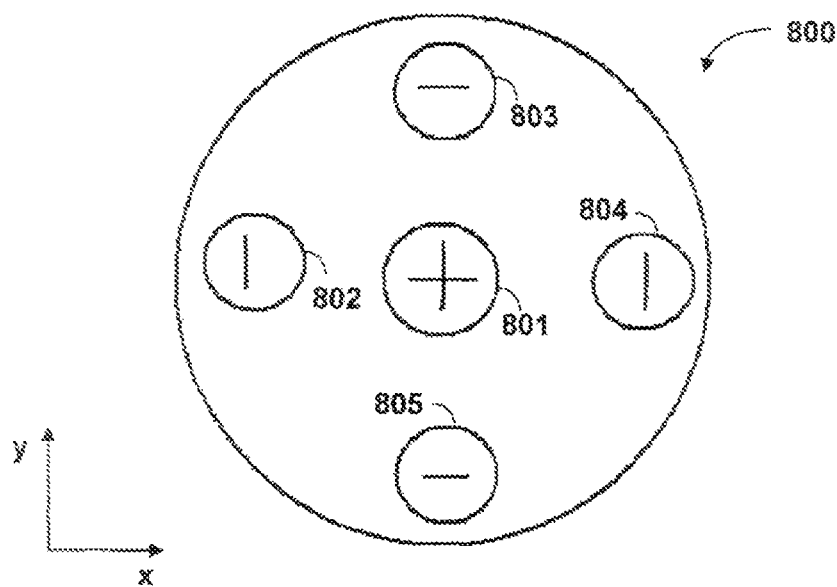

Furthermore, it is also possible to set illumination settings with regions of a higher degree of polarization and regions of a lower degree of polarization, by suitable quantitative regulation of the polarization directions. An example in this respect is shown in FIG. 8 in the form of an illumination setting in respect of which unpolarized light is set in the central region 801 of the pupil plane and what is referred to as xy-polarization (also quasi-tangential polarization distribution) is set in outer regions 802, 803, 804 and 805 of the pupil plane.

Figure 9:
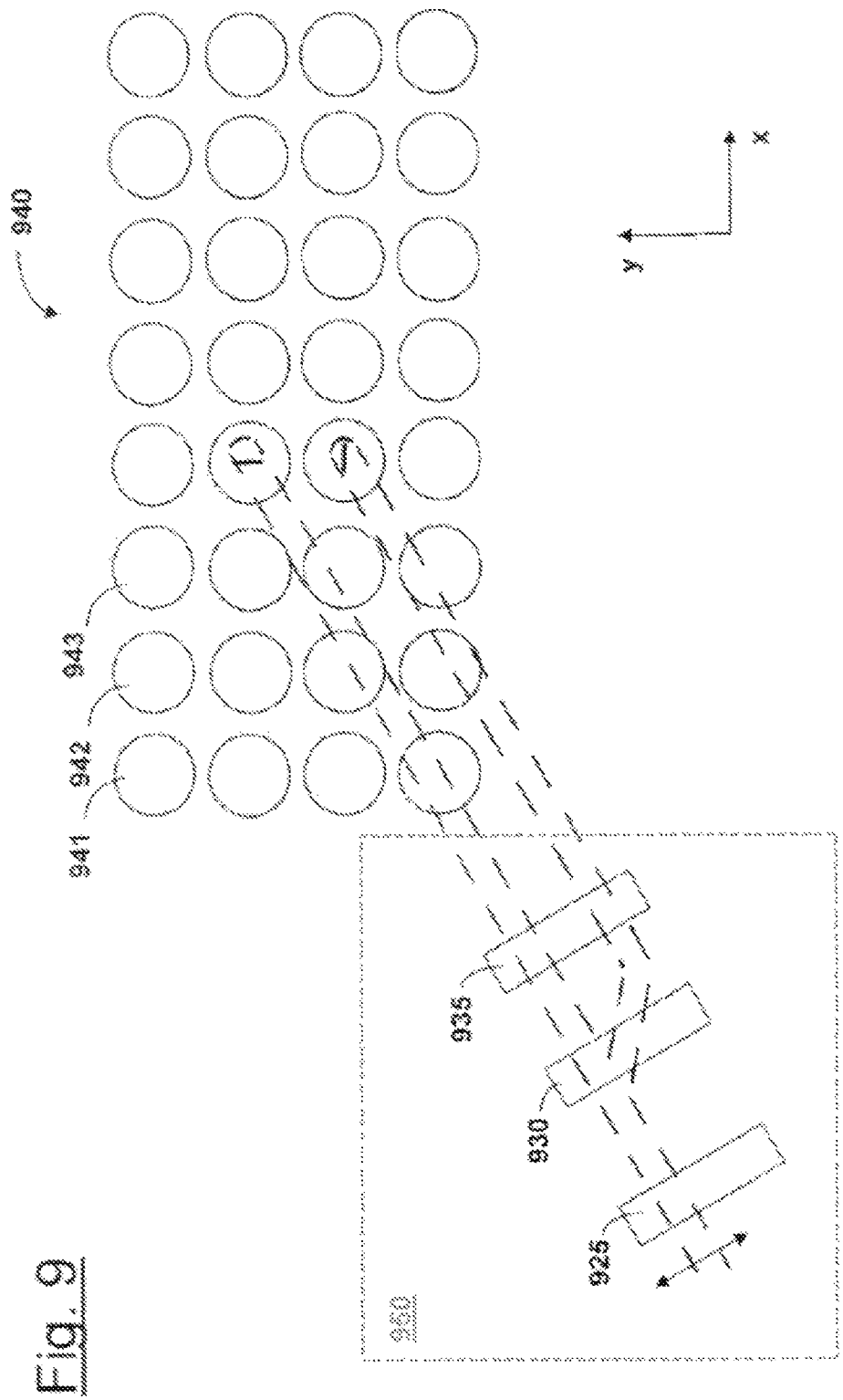

In a further embodiment shown in FIG. 9 the position of a birefringent element 930 remains fixed (the birefringent element 930 is here therefore not rotated upon a variation in the orientation of the mutually perpendicular polarization directions), while a rotatable lambda/2-plate 935 is arranged downstream of the birefringent element 930 in the light propagation direction. While the first lambda/2-plate 925 arranged upstream of the birefringent element 930 in the light propagation direction, as described hereinbefore, provides the desired energy regulation for the partial rays, the further lambda/2-plate 935 provides for setting a desired orientation in respect of the mutually perpendicular polarization directions of the ordinary and extraordinary rays produced via the birefringent element 930. As in this construction both the ordinary and also the extraordinary rays each remain at the same respective location, the mirror arrangement 940 used is an arrangement of simple circular mirrors 941, 942, 943, . . . instead of the above-described arrangement of mirror units composed of an inner circular mirror and an outer ring mirror. In this construction as in the above-described embodiments, first mirror units can also be optimized for a first polarization direction and second mirror units can be optimized for a second polarization direction which is perpendicular to the first polarization direction. For that purpose the first mirror units and the second mirror units can have in particular mutually different coatings. The arrangement can then be so selected that for example the first mirror units respectively reflect the ordinary rays and the second mirror units respectively reflect the extraordinary rays.

Figure 24:
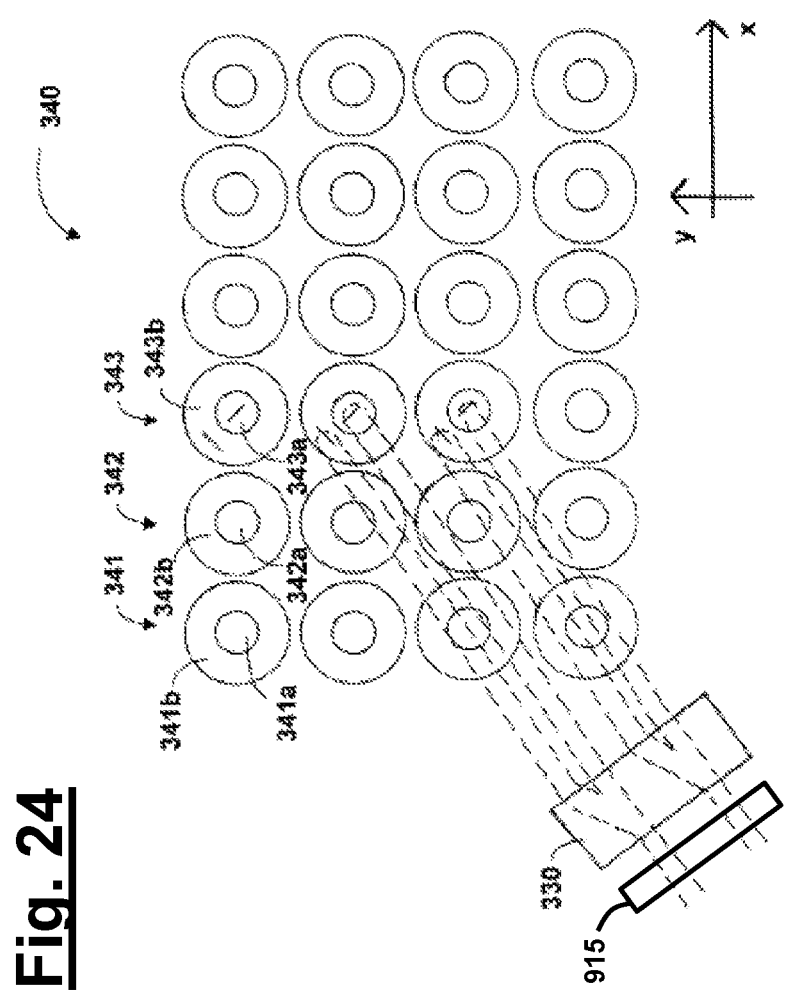
FIG. 24 shows a diagrammatic view to describe an arrangement according to the disclosure in a first exemplary embodiment including an additional polarizer.

In accordance with a further configuration, all above-described embodiments can include an additional polarizer for refreshing the polarization state, being disposed in particular upstream of the mirror arrangement, after the beam feed unit. Via such a polarizer, the transmission direction of which can coincide for example with the preferred polarization direction of the laser light produced by the light source and which is only diagrammatically shown in FIG. 11 and which is identified by reference 915, it is possible to set a well-defined polarization state, with light components involving an unwanted polarization state being coupled out, while for example effects which occur in the beam feed unit and which lead to imperfect polarization of the laser light can be taken into account. FIG. 24 shows a diagrammatic view of an arrangement according to the disclosure in a first exemplary embodiment including an additional polarizer which is identified by reference 915 for refreshing the polarization state.

Figure 10:
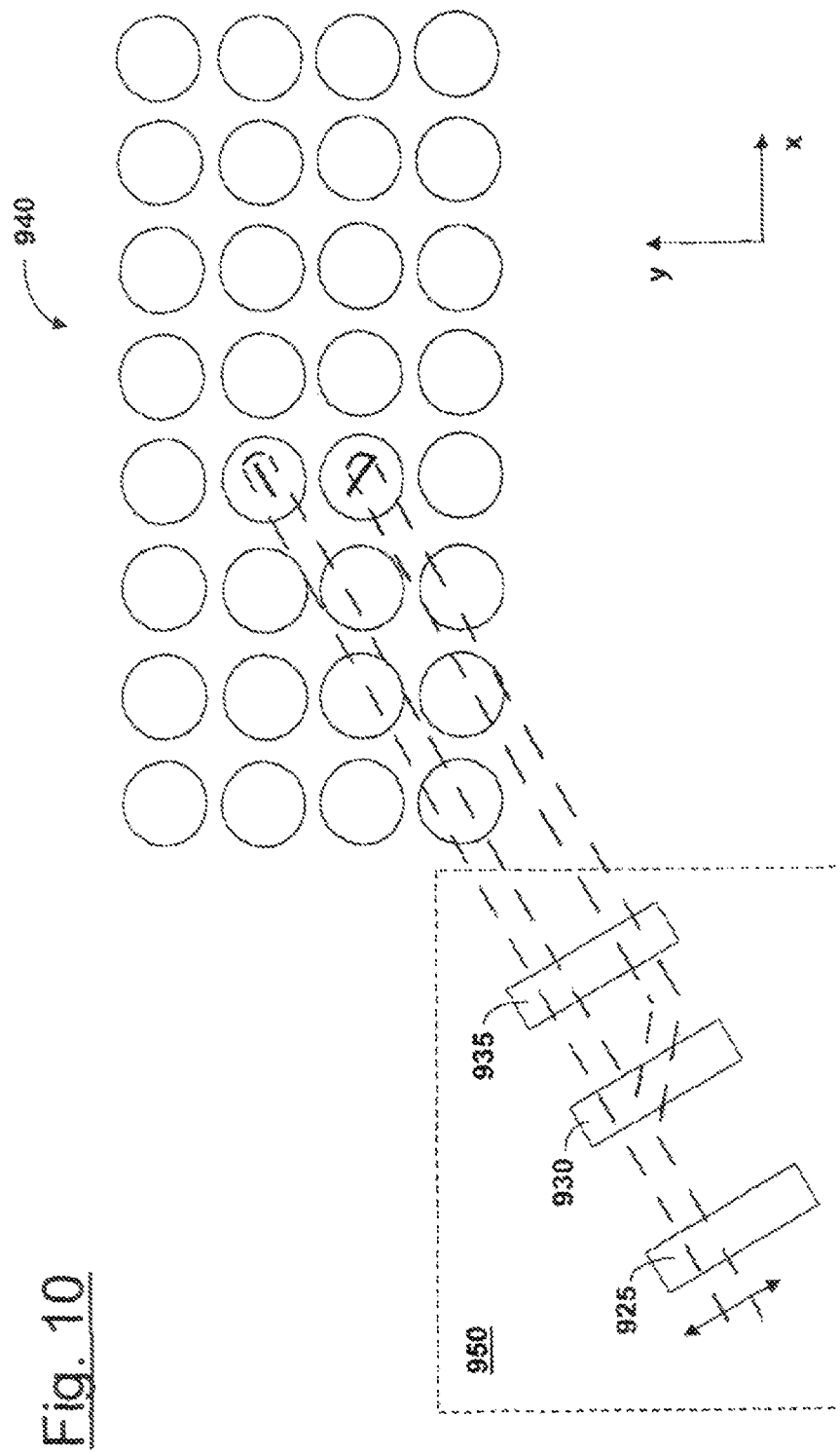
Figure 11:
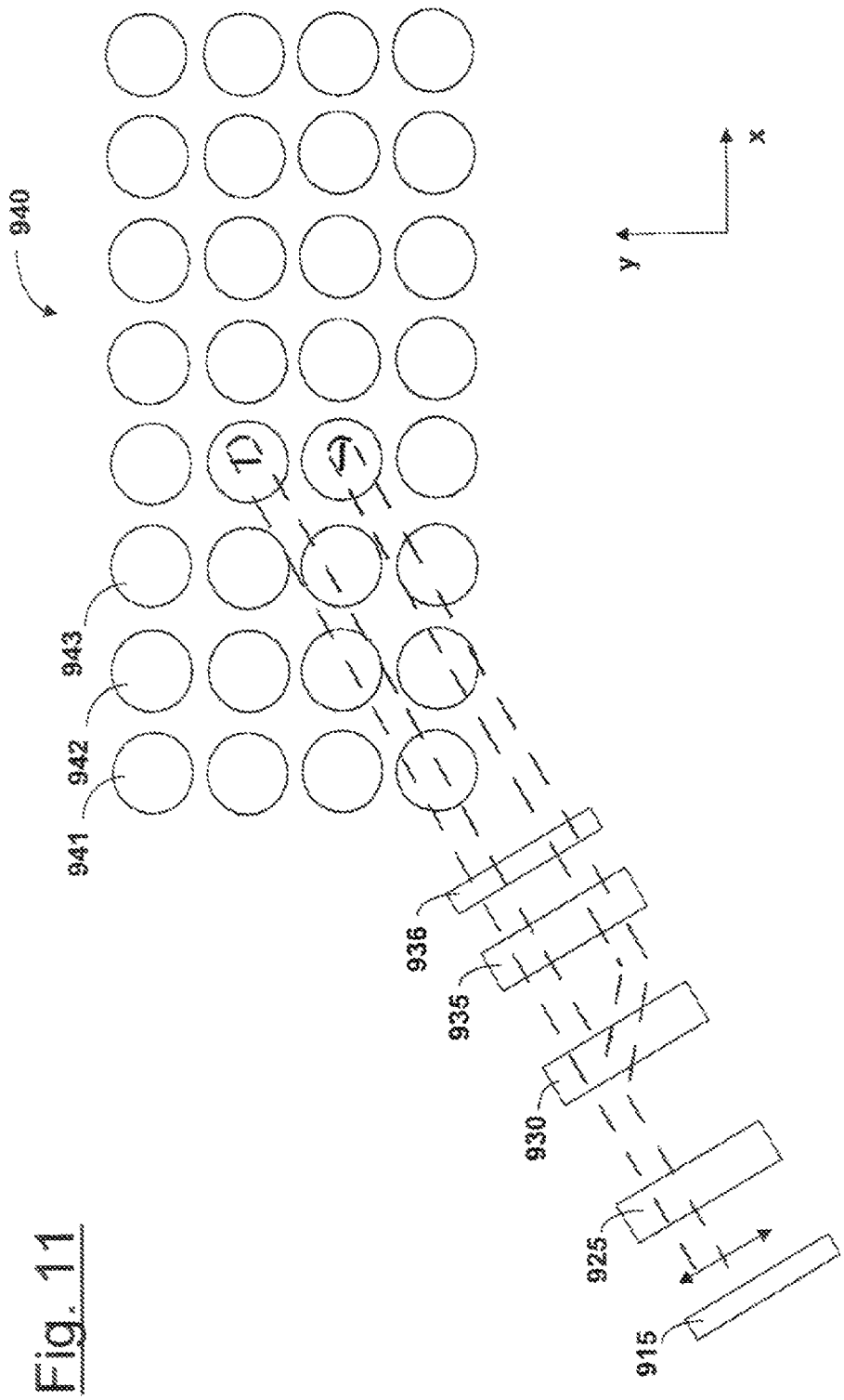

In a further embodiment as shown in FIG. 11, in a modification of FIG. 10, a rotatable lambda/4-plate 936 can be arranged between the lambda/2-plate 935 and the mirror arrangement 940. In that way, left and right circularly polarized light, or also any elliptically polarized light, can be produced at adjacent circular mirrors 941, 942, 943, . . . . In particular an ellipticity of the polarization state, which occurs elsewhere in the system (for example upstream of the mirror arrangement 940 in the beam feed unit, or also downstream of the mirror arrangement 940), can be maintained or subsequently compensated, without light loss.

In accordance with a further configuration, all above-described embodiments can include an additional polarizer for refreshing the polarization state, being disposed in particular upstream of the mirror arrangement, after the beam feed unit. Via such a polarizer, the transmission direction of which can coincide for example with the preferred polarization direction of the laser light produced by the light source and which is only diagrammatically shown in FIG. 11 and which is identified by reference 915, it is possible to set a well-defined polarization state, with light components involving an unwanted polarization state being coupled out, while for example effects which occur in the beam feed unit and which lead to imperfect polarization of the laser light can be taken into account.

The disclosure is not limited to the configuration of the birefringent element implementing beam splitting into an ordinary and an extraordinary ray, in the form of a plane-parallel plate. In accordance with a further embodiment the birefringent element can also be in the form of a prism, as described hereinafter with reference to FIGS. 12*a* and 12*b*.

Figure 12B:
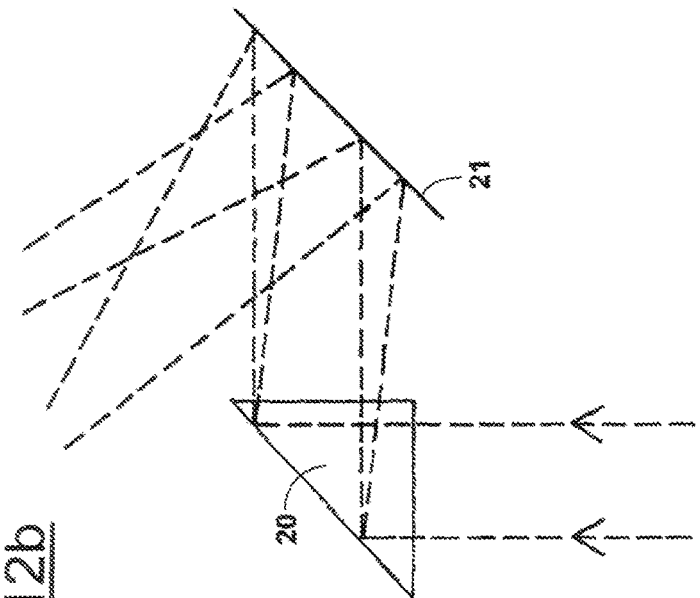
Figure 12A:
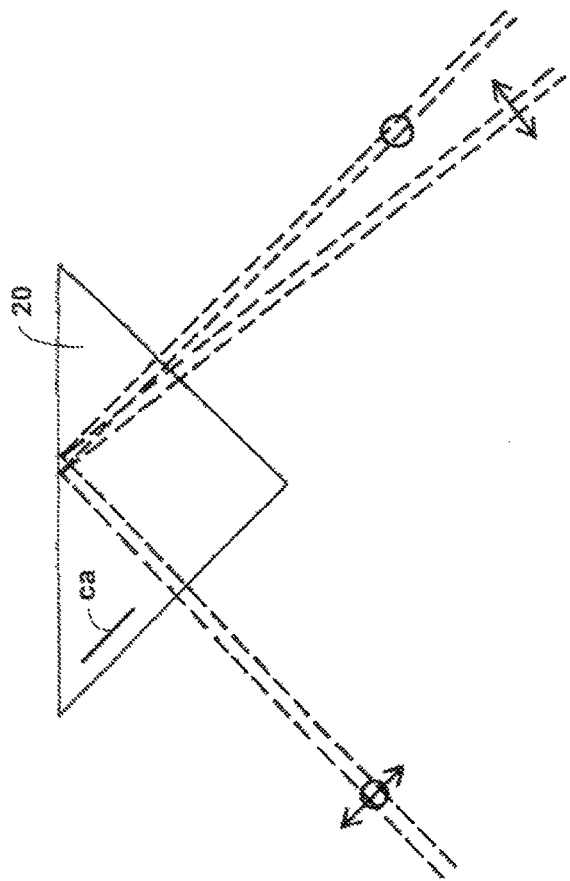

As shown in FIG. 12*a* a birefringent element 20 is in the form of a right-angled prism and includes an optically uniaxial crystal material (for example magnesium fluoride, $MgF_2$), wherein the light entrance surface of the prism like also the direction of the diagrammatically illustrated optical crystal axis identified by "ca" are oriented perpendicularly to the light propagation direction of the incident light. Instead of magnesium fluoride ($MgF_2$) the prism can also be made from another suitable optically uniaxial crystal material, for example sapphire ($Al_2O_3$) or lanthanum fluoride ($LaF_3$).

After total reflection in the prism, splitting into an ordinary ray and an extraordinary ray occurs as shown in FIG. 12*a*, similarly to the above-described embodiments, for the individual partial rays passing through the prism. Unlike the previous embodiments however, as shown in FIG. 12*a*, the ordinary ray and the extraordinary ray do not issue from the prism in parallel relationship but at an angle to each other (which is typically of the order of magnitude of about 10 mrad), so that in each case the spatial distance between the ordinary ray and the extraordinary ray increases with an increasing distance from the prism. The dimensions of the prism used in FIG. 12*a* are to be suitably selected depending on the respective specific factors involved, in which respect the dimensions of the light entrance surface of the prism, just by way of example, can be of the order of magnitude in a range of between $(20*20)$ mm$^2$ and $(40*40)$ mm$^2$.

FIG. 12*b* shows downstream of the birefringent element 20 in the light propagation direction a mirror arrangement 21, wherein once again the configuration of the ordinary and extraordinary rays is diagrammatically indicated therein. As a consequence of the increase in the spatial distance between the ordinary and the extraordinary rays with increasing distance from the birefringent element 20, adaptation to the period of the mirror arrangement 21 can now be effected by a suitable choice of the distance between the birefringent element 20 and the mirror arrangement 21.

As can be seen from FIGS. 12a and 12b a further action achieved by virtue of the prism-shaped configuration of the birefringent element 20 is that the light, as a consequence of the total reflection which takes place (through for example an angle of about 90°), is deflected or corresponding folding of the optical axis of the illumination system is achieved.

The birefringent element 20 in prism form in FIGS. 12a and 12b can be used in the structure of FIG. 9, FIG. 10 or FIG. 11 instead of the birefringent element 930, wherein the lambda/2-plate 935 provided therein, as was described with reference to FIGS. 9-11, respectively provides for setting a desired orientation of the mutually perpendicular polarization directions of the ordinary and extraordinary rays produced by the birefringent element 20.

The variant of the disclosure shown in FIGS. 12a and 12b is not limited to the configuration of the birefringent element 20 in the form of a right-angled prism so that it is also possible to adopt prism shapes which are not right-angled or wedge shapes deviating from the right-angled form, for the design configurations of the birefringent element 20.

According to a further aspect of the disclosure, the flexibility introduced by the mirror arrangement. in combination with the inventive element used for producing different states of polarization incident on different mirror units is advantageously used to produce illumination settings of the kind explained in the following with reference to FIG. 13, which are advantageous in certain operating conditions. As already explained in the upper part of the specification, such situations may arise e.g. if in the approach called "design for manufacturing" (DFM) the mask is provided with additional or modified structures being selected such that the desired imaging result is obtained on the wafer in consideration of e.g. diffraction effects or the like occurring in the optical system, so that also modified or adapted illumination settings are involved.

FIG. 13 shows a schematic illustration to explain illumination settings which are produced in the illumination system according to the present disclosure in a further aspect of the disclosure. In FIG. 13, the illumination setting 30 includes several pairs of regions 31a-b, 32a-b, 33a-b and 34a-b, wherein the regions of each pair are arranged in point symmetrical relationship with respect to the pupil center, and wherein there is a large difference between the size or area of the smallest regions (in FIG. 13: 34a-b) and the size or area of the largest regions (in FIG. 13: 31a-b). Furthermore, in the embodiment of FIG. 13, the polarization states in the regions of each pair of regions are identical. According to a further embodiment, the polarization states may also be, for the regions of each pair, orthogonal to each other. In FIG. 13, these polarization states are as follows: regions 31a-b=linear polarization in x-direction, 32a-b=unpolarized, 33a-b=linear polarization along 45° with respect to x- or y-direction and 34a-b=circular polarization. Of course, the disclosure according to this aspect is not limited to the specific shape, number or size of the several regions in the illumination setting of FIG. 13, and many more embodiments of illumination settings are possible showing the properties and advantages as explained above.

In the following, further embodiments of the disclosure are explained with reference to FIGS. 14-16, wherein the element used for producing the different states of polarization incident of different mirror units differ from the embodiments that have been explained before with reference to FIGS. 2-11.

Figure 14A:
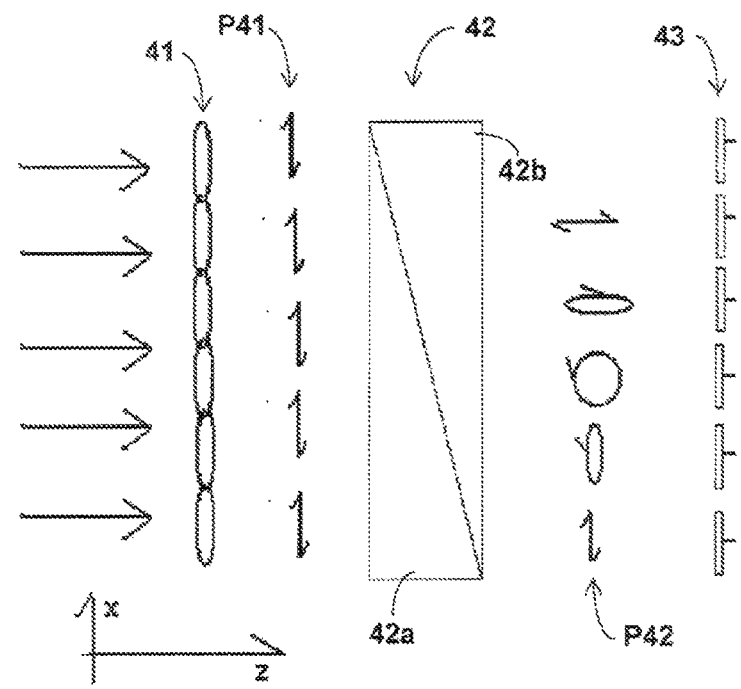
FIGS. 14a-14b, 15a-15b, 16a-16b-17 show schematic illustrations to explain the effect of further exemplary embodiments of the present disclosure.

FIG. 14a, shows, along the light propagation direction (z-direction) a microlens arrangement 41, a so-called Hanle-Depolarisator 42 (including two wedge-shaped elements 42a and 42b of birefringent material, with the optical crystal axis being oriented in the x-y-plane and under 45° with respect to each other for the two elements 42a and 42b) and a multi-mirror arrangement 43 as already described before. FIG. 14a also schematically illustrates the polarization state P41 of the light incident on the Hanle-Depolarisator 42, as well as the polarization state P42 directly downstream of the Hanle-Depolarisator 42. As basically known, the Hanle-Depolarisator produces, along the wedge direction, different polarization states P42. More particularly, the polarization state is varied along the wedge direction, from linear polarization via elliptical polarization to circular polarization and back to linear polarization (with rotated polarization direction). It can be easily seen in FIG. 14a that different mirrors in the mirror arrangement 43 are, as a consequence of the Hanle-Depolarisator 42, illuminated with light-portions of different polarization states, which again can be sent to different positions in the pupil plane using the individual mirrors of the mirror arrangement 43 as has already been explained above. Furthermore, the arrangement shown in FIGS. 14a-b is advantageous insofar as it has a relatively simple structure and manufacturing.

Figure 14B:
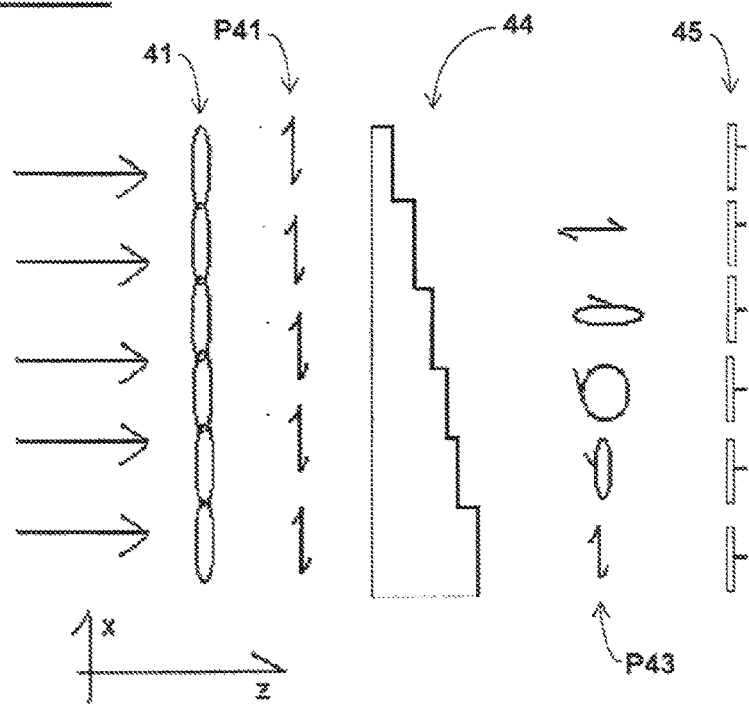

A further embodiment is shown in FIG. 14b, wherein the wedge 42a in the embodiment of FIG. 14a has been modified to involve a light exit surface being structured according to a step function. An advantage of this embodiment is that the polarization state of the light leaving the element 44 is constant along each step and, for appropriate correspondence between the dimensions of the steps in the element 44 and the mirrors in the multi-mirror arrangement 45, along each individual mirror of the multi-mirror arrangement 45.

Figure 15A:
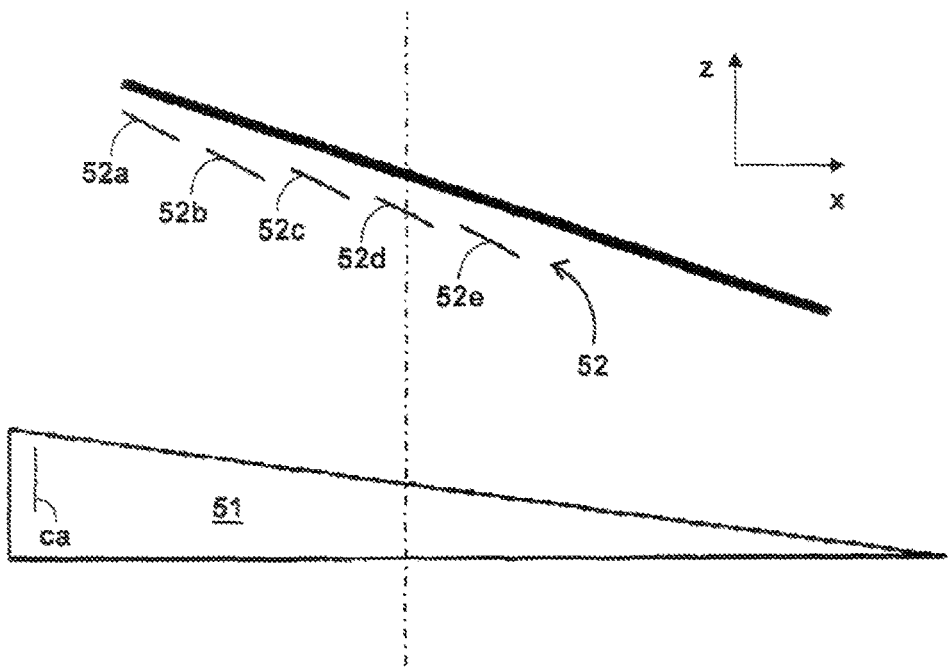

According to a further embodiment which is schematically illustrated in FIG. 15a, the element for producing different states of polarization can also be made of optically active material, e.g. crystalline quartz material having the crystal axis parallel to the light propagation direction (z-direction). FIG. 15a shows such an element 51 which again has a wedge-shaped geometry with the wedge direction along the x-direction of the coordinate system shown in the drawing. Accordingly, light that propagates inside the element 51 along the z-direction is subject to circular birefringence, having the effect that the directions of polarization of parallel linearly polarized light rays are rotated by an angle that varies dependent on the location where the light ray traverses the element 51. In combination with this effect, the individual mirror units 52a, 52b, 52c, . . . can be displaced independently of each other in order to select, for each polarization state produced by the element 51, the appropriate reflection angle or the appropriate illuminated region of the pupil plane, respectively.

Figure 15B:
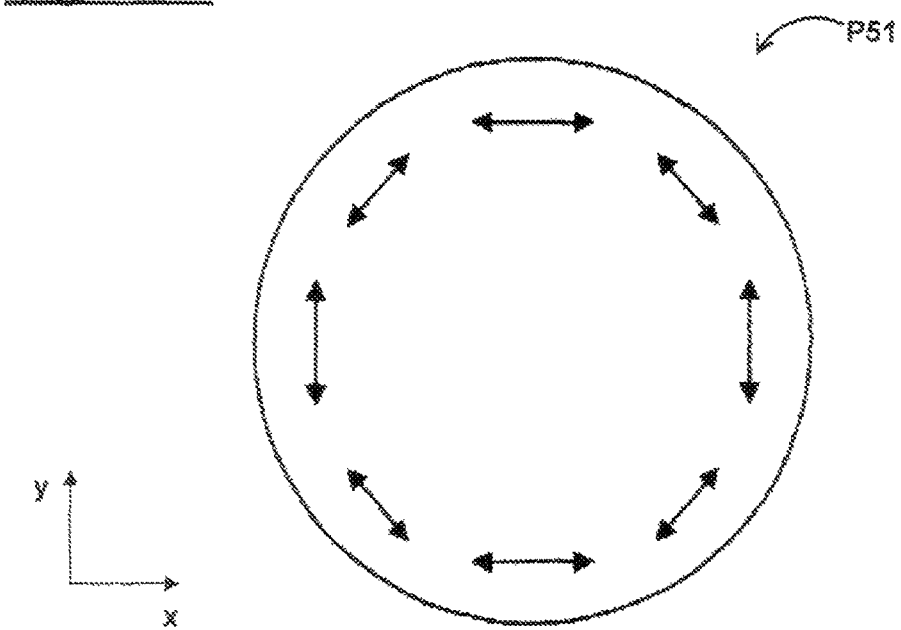

FIG. 15b shows, by way of an example, an (at least approximate) tangential polarization distribution which may be realized using the concept explained above with respect to FIG. 15a. By changing the wedge angle, i.e. the orientation of the wedge relative to the x-direction or the profile of the laser beam, the mixing of the light or the homogeneity of the light intensity, respectively, can be improved. In this embodiment, the disclosure also advantageously uses the flexibility provided by the combination with the multi-mirror arrangement, and furthermore is advantageous with respect to relatively easy manufacturing and production of less (or easier to be corrected) wavefront errors.

Figure 16A:
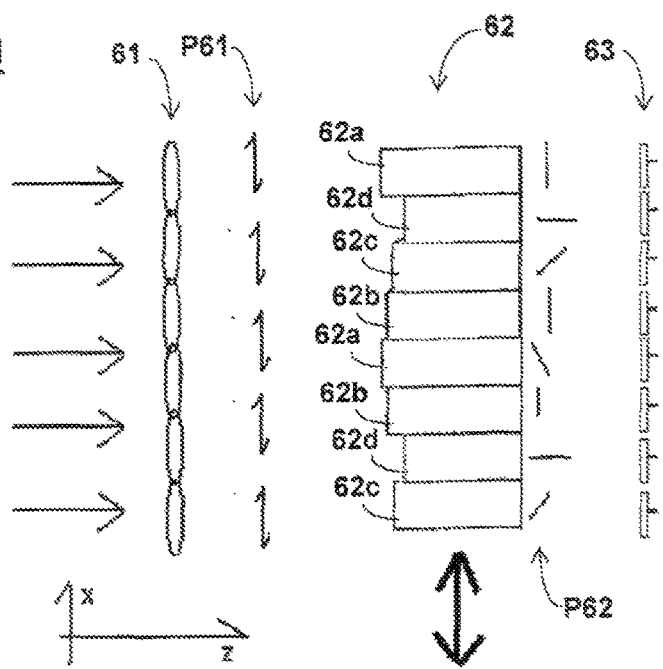
Figure 16B:
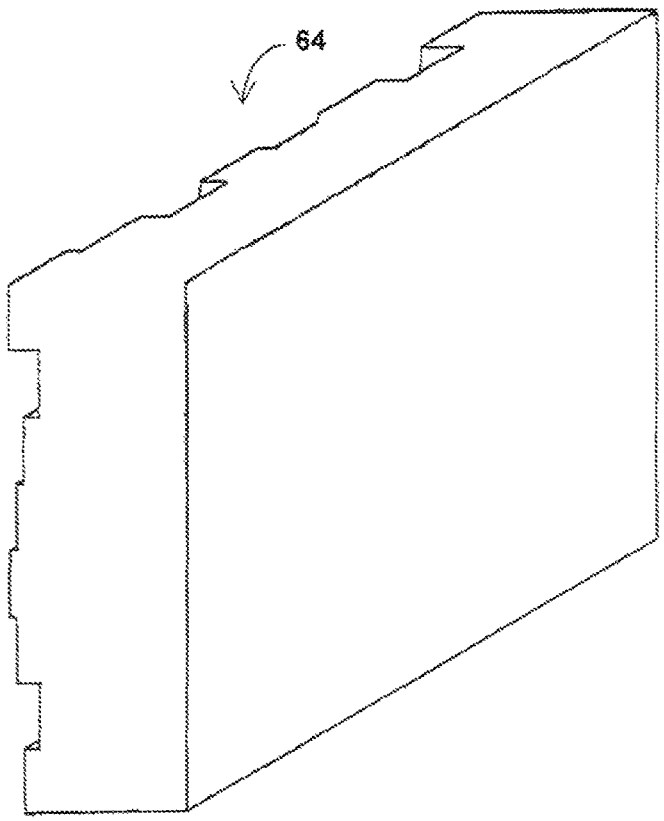

It is to be noted that the disclosure according to the above embodiments is not limited to a wedge-shape of the element used to produce different polarization states, and that other embodiments of elements having a varying thickness profile measured in the light propagation direction are possible. FIGS. 16a-c show embodiments where an element 62 or 64, respectively, which is arranged between a microlens arrangement 61 and a mirror arrangement 63 in line with the embodiments explained before, includes a plurality of plane-parallel sections or blocks, wherein at least some of the blocks have a different thickness measured in the light propagation direction. As shown for the element 64 in FIG. 16b, this element 64 can be made from one piece e.g. by etching-processes or the like, so that a monolithic structure as illustrated in FIG. 16b is obtained.

The element 62 is again made of an optically active material such as quartz, wherein the optical crystal axis is parallel to the light propagation direction (z-direction). Consequently, the plane of oscillation of the electrical field vector of light that passes the element 62 is rotated by an angle proportional to the distance traveled by the light inside the element 62, i.e. to the thickness of the blocks 62a, 62b, . . . .

Figure 17:
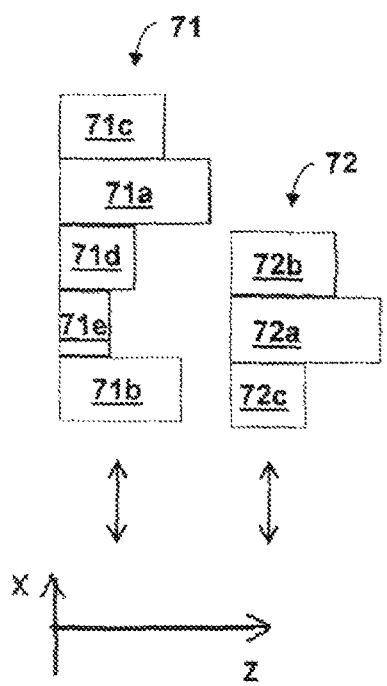

According to a further embodiment schematically shown in FIG. 17, it is also possible to combine two elements 71, 72 (which can be identical or different), each having a structure as explained above with reference to FIG. 16a-b, which can be moved relative to each other in a plane perpendicular to the light propagation direction, e.g. the x-direction. As a consequence it is possible to vary the distance traveled by the light in each of the elements 71, 72 and thereby to manipulate the achieved change of the polarization distribution.

FIGS. 18a-b show a realization of this concept while using at least two wedge-shaped elements 81, 82 which are movable relative to each other in a plane perpendicular to the light propagation direction, e.g. the x-direction, using a control device 83. The two wedge-shaped elements 81, 82 can exhibit either linear birefringence or circular birefringence (i.e. optical activity), wherein in the latter case the two wedge-shaped elements 81, 82 can either have the same or opposite sign of optical rotation. Furthermore, a plurality of such pairs can be arranged, according to FIG. 18b, such that each row 84a, 84b, 84c, . . . of mirror units in the mirror arrangement 84 is allocated to one pair of wedge-shaped elements 81, 82. Accordingly, it is possible to dynamically produce, using the arrangement of FIG. 18a-b, a plurality of different polarization states, wherein the number of these polarization states corresponds to the number of rows 84a, 84b, 84c, . . . of mirror units in the mirror arrangement 84.

For both embodiments of FIG. 17 and FIG. 18, it becomes possible to "shift" the polarization states along the mirror units of the mirror arrangement, which can also be realized in a controlled manner and in particular "online" during use of the lithographic system.

Figure 19:
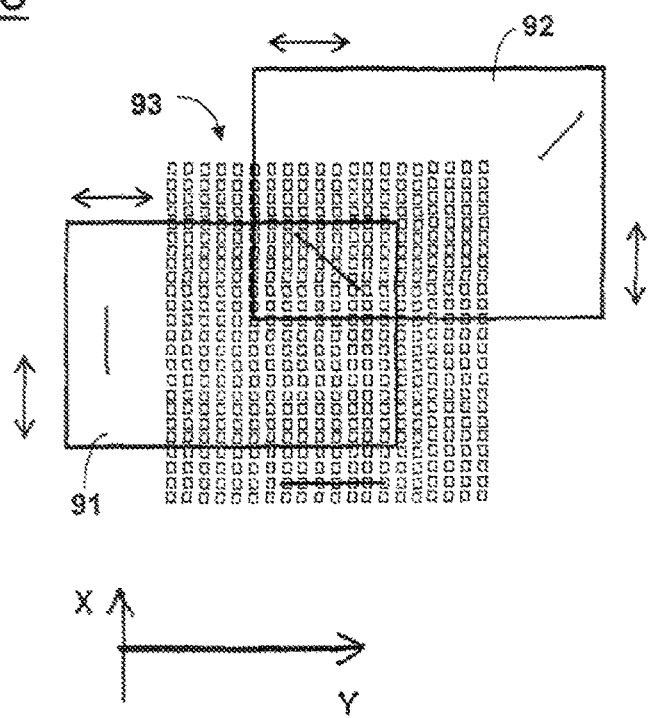

FIG. 19 shows a further embodiment where two plane-parallel elements 91, 92 are movable relative to each other in a plane perpendicular to the light propagation direction, wherein each element 91, 92 can be independently moved in x- and y-direction. Again, as a consequence, it is possible to vary the distance traveled by the light in each of the elements 91, 92 and thereby to manipulate the achieved change of the polarization distribution in front of the mirror arrangement 93. If, by way of an example, element 91 effects a rotation of the polarization direction by 90° and element 92 effects a rotation of the polarization direction by 45°, the variable overlap of elements 91 and 92 can be used to realize four different polarization states (by rotation of either 0°, 45°, 90° or 135°), which can be dosed or modified in their relative contributions to the total intensity obtained in the pupil plane.

The disclosure is not limited to embodiments in which the element for producing at least two different states of polarization incident on different mirror units is birefringent. It is also possible to use non-birefringent elements or arrangements for modifying the polarization state. FIG. 20 schematically shows such an embodiment of the disclosure, wherein a polarization-beam-splitter arrangement 200 is used. The arrangement 200 includes semitransparent layers 211-214, which change the polarization state of the light transmitted therethrough as well as the polarization state of the reflected light, as well as high-reflective mirrors 215-218 for reflecting the light rays that have been reflected by mirrors 211-214 along the original propagation direction. If, by way of example, the light 220 incident on semitransparent layers 211-214 is circularly polarized, this light is modified, when being reflected at the layers 211-214, into linear polarized light having the polarization direction along the x-axis (i.e. s-polarized light). The light rays which are transmitted through the layers are, when leaving the layers 211-214, linear polarized light having the polarization direction in the y-z-plane (i.e. p-polarized light). Furthermore, the light rays which are passing the arrangement between the layers 211-214 (i.e. through the spaces therebetween) are still circularly polarized downstream of the arrangement 200. As has already been described with respect to the other embodiments of the disclosure, these different polarization states existing in the light 230 downstream of the arrangement 200 can be reflected by different mirror units and thereby directed to different positions of the pupil plane.

In further embodiments, the inventive concept can also be used to compensate for retardations that are produced by the optical components of the illumination system (in particular lenses or mirrors) and which typically vary across the pupil plane or the field (or reticle) plane, respectively, and/or for a compensation of birefringence introduced in the system by the reticle (mask). Since as a consequence of such retardations the so-called IPS value is typically reduced, a compensation of these effects is desirable. The IPS value is used to describe the degree to which a desired state of polarization is realized at a specific location (its average over the scan direction is called "scanned IPS value"). The abbreviation IPS stands for "Intensity in Preferred State", and the IPS value indicates the energy ratio between the light intensity in the intended direction of polarization (which can be measured, e.g. with an ideal polarizer whose transmitting direction is set to the intended direction) and the total intensity.

Figure 21:
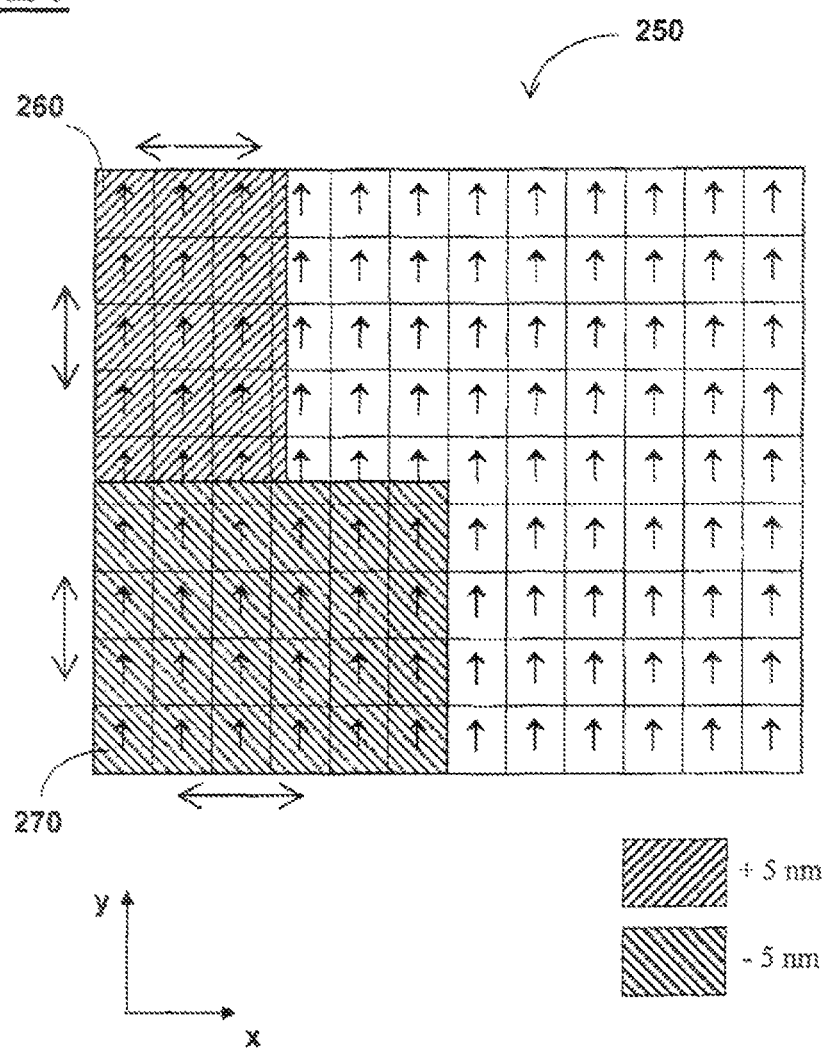
Figure 22:
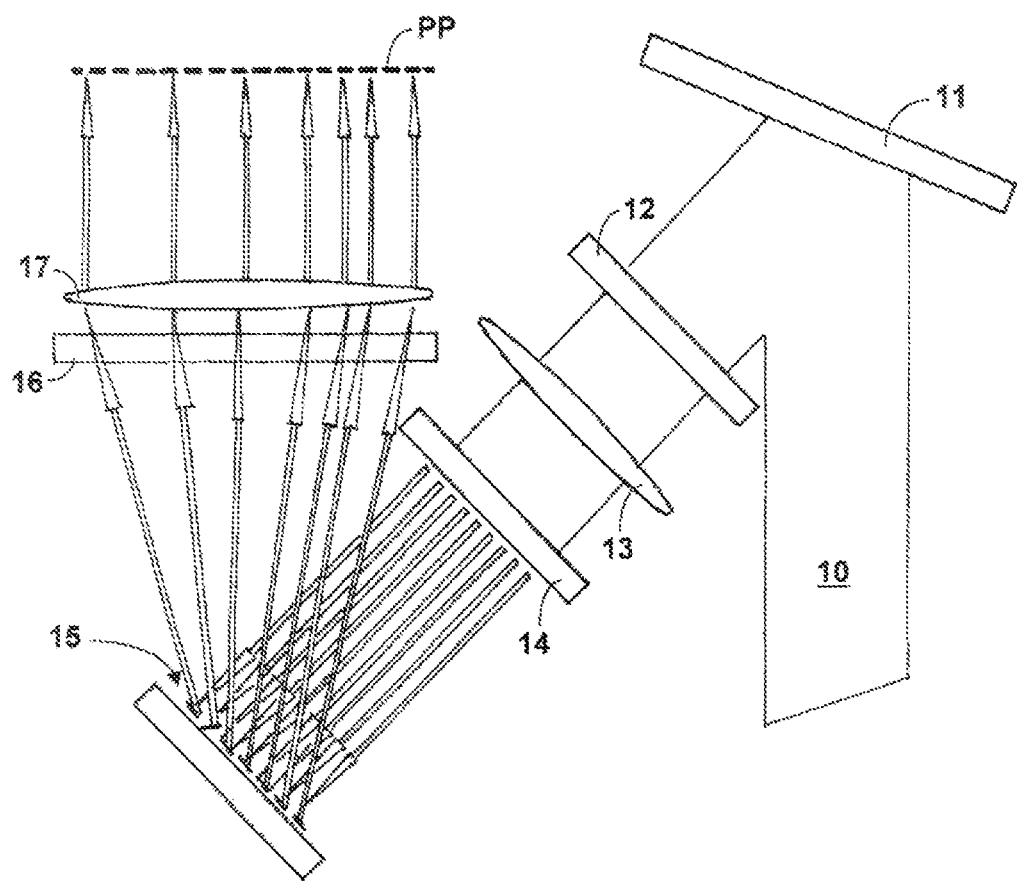
FIG. 22 shows a diagrammatic view of a portion of an illumination system with a mirror arrangement in accordance with the state of the art.

FIG. 21 shows a schematic illustration of such an embodiment, wherein a mirror arrangement 250 of mirror units is partially "covered" by optical retardation plates 260, 270, which shall express that the retardation plates 260, 270 are located immediately in front of (i.e. upstream) of a part or portion of the mirror arrangement 250. According to an alternative embodiment, the retardation plates 260, 270 can also be arranged immediately downstream of the mirror arrangement 250 if the distance between the mirror arrangement 250 and the retardation plates 260, 270 is selected such that the individual light rays have not yet mixed with each other or were not subject to a large deflection when passing the distance from the mirror arrangement to the retardation plates.

In the embodiment of FIG. 21, the retardation plate 260 effects, for light passing therethrough, a positive retardation of +5 nm, whereas the retardation plate 270 produces for light passing therethrough a negative retardation of −5 nm.

Of course the disclosure according to this aspect is not limited to these specific retardation values produced by the retardation plates, which are only given by way of example and which may also differ from each other for the two plates 260, 270. The retardation values provided by the retardation plates are significantly smaller than one half of the operation wavelength (e.g. <<96.5 nm if an operation wavelength of 193 nm is used).

A suitable material, from which the retarder plates can be manufactured, is e.g. crystalline quartz (for which the difference between the refractive indices $n_o$ and $n_e$ is approximately 0.013465 at a working wavelength of 193 nm). If crystalline quartz is used, a retarder plate that according to the embodiment produces a retardation of +5 nm may have a thickness of 0.4 μm+m*14.3 μm (m=1, 2, 3, ... ), wherein values of m of 1 or larger correspond to "higher order" retardation plates yielding an enhanced mechanical stability. Of course, also other suitable (in particular optically uniaxial) materials can be used in the retardation plates, for example magnesium-fluoride ($MgF_2$).

Although the use of two retardation plates having retardations of opposite sign is not mandatory (so that also two plates of same sign or only one single retardation plate can be used), this is advantageous in so far as it allows for an effective compensation in illumination systems where regions of opposite retardation in the pupil plane are produced by the optical components of the illumination system, since light having the appropriate retardations after passing the first or second retardation plates just needs to be directed to the appropriate region in the pupil plane.

By appropriate adjusting the respective positions of the retarder plates 260 and 270 as described above, an adjustment of the distribution of the IPS value, which can be named as "IPS tuning", can be realized. The parameters which can be modified or optimized with the above concept include not only the (absolute) IPS value, but also e.g. the minimum IPS value obtained in the field, the field variation of the IPS value, the so-called IPS pole balance or the IPS ellipticity. Furthermore, the above concept can be used for the so-called "tool-to-tool matching", i.e. the modification of at least one of two microlithographic exposure systems such that the combination of illumination system, reticle (mask) and projection objective ideally yields the same result of the lithographic process in case of a change between these two systems.

Like in some embodiments described before, the retardation plates 260, 270 are, according to some embodiments, movable with respect to each other and with respect to the mirror arrangement 250 (see double-headed arrows in FIG. 21), so that an additional degree of freedom is obtained regarding the manipulation of the polarization performance, which may e.g. also account for asymmetric retardation effects to be compensated in the system. In particular, the retardation plates 260, 270 may each be arranged to be displaceable in the x- and y-direction. With the flexibility regarding the position of the retardation plates 260, 270 obtained thereby, it is possible to adjust the number and position of those mirror units that are "covered" by one or two retardation plates 260, 270 in a flexible manner and thereby adjust or modify the polarization distribution obtained in the pupil plane. Furthermore, the polarization performance can be even modified dynamically during operation of the illumination system or during the scanning process, respectively. Moreover, in addition to a compensation of the above-described retardation effects in the pupil plane, it is also possible to realize an at least partial correction of field dependent polarization effects.

By making an appropriate adjustment of the individual mirror units in the mirror arrangement, the respective regions in the pupil plane can be illuminated with light bearing a retardation (i.e. the difference in the optical paths of two orthogonal, or mutually perpendicular, polarization states) that is appropriate to realize the above-mentioned compensation concept.

The above-described concept is not restricted to a certain illumination setting or polarization distribution, but may be realized in any setting or any polarization distribution, including e.g. a tangential or quasi-tangential polarization distribution as already shown in FIG. 15b. By way of an example, the above concept (of one or two movable retarder plates combined with a mirror arrangement) can be combined with the use of a polarization-modulating optical element as disclosed in WO 2005/069081 A1. Such an element includes an optically active crystal with an optical axis and a thickness profile which, as measured in the direction of the optical axis, is variable and can e.g. be used to transform a constant linear polarization distribution into a tangential polarization distribution.

Furthermore, the above-described concept is not restricted to the use of plane-parallel retarder plates, so that also retarder elements of different geometry such as e.g. wedge-shaped element, or elements that exhibit circular birefringence (i.e. optical activity), may be used instead of, or in combination with, the retardation plates, for example in arrangements as described before with respect to FIGS. 14a-b.

Figure 23:
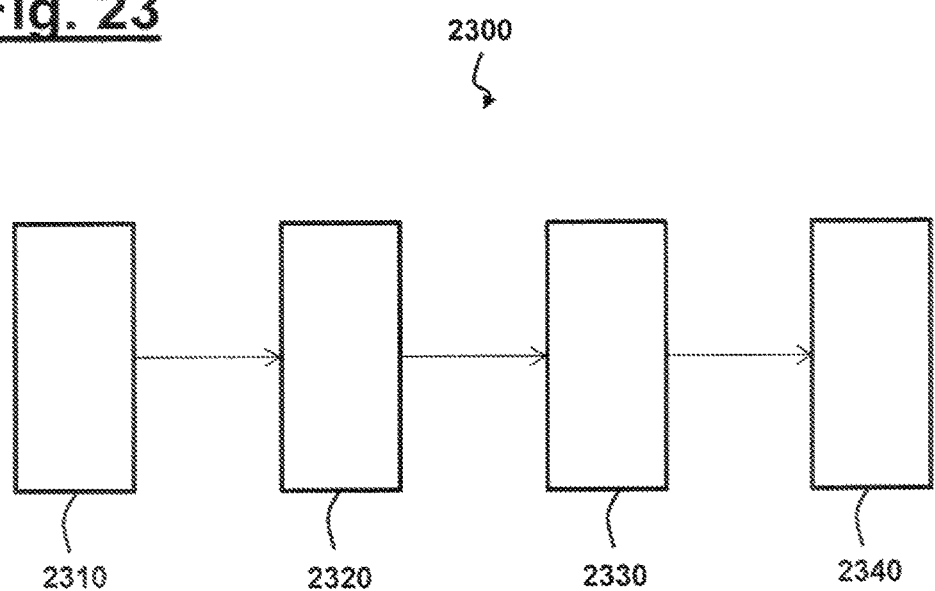
FIG. 23 shows a schematic illustration of a microlithographic projection exposure apparatus.

FIG. 23 shows a schematic illustration of a microlithographic projection exposure apparatus 2300 including an illumination system 2310 and a projection objective 2330.

The illumination system 2310 illuminates a mask 2320, and the projection objective 2330 projects an image of the mask 2320 onto a substrate 2340.

Even if the disclosure has been described by specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

The invention claimed is:

1. An illumination system, comprising:
a mirror arrangement comprising a plurality of mirror units displaceable independently of each other to alter an angle distribution of light reflected by the mirror arrangement; and
an arrangement comprising first and second elements, wherein:
the first element comprises a birefringent material;
the second element comprises a birefringent material;
a relative position of the first and second elements is variable;
the illumination system is configured so that adjusting respective positions of the first and second elements adjusts: a) a number and a position of mirror units that overlap with at least one of the first and second elements and b) a polarization distribution in a pupil plane of the illumination system during use of the illumination system;
the first and second elements are movable in two directions that are perpendicular to each other and perpendicular to a light propagation direction; and the illumination system is a microlithographic illumination system.

2. The illumination system of claim 1, wherein the first and second elements are independently movable in a plane perpendicular to a light propagation direction.

3. The illumination system of claim 1, wherein the first and second elements are immediately upstream of a portion of the mirror arrangement.

4. The illumination system of claim 3, wherein the illumination system is configured so that, during use of the illumination system, different polarization states existing in the light downstream of the arrangement are reflected by different mirror units and thereby directed to different positions of the pupil plane.

5. The illumination system of claim 1, wherein the first and second elements are immediately downstream of a portion of the mirror arrangement.

6. The illumination system of claim 1, wherein the first and second elements comprise retardation plates.

7. The illumination system of claim 6, wherein the retardation plates have retardations of opposite sign.

8. The illumination system of claim 1, wherein the first and second elements exhibit circular birefringence.

9. The illumination system of claim 8, wherein the first and second elements have the same sign of optical rotation.

10. The illumination system of claim 8, wherein the first and second elements have the opposite sign of optical rotation.

11. The illumination system of claim 8, wherein the first and second elements comprise crystalline quartz.

12. The illumination system of claim 1, wherein the first and second elements have a varying thickness profile measured in a light propagation direction.

13. The illumination system of claim 1, wherein the first and second elements are wedge-shaped elements.

14. The illumination system of claim 13, wherein one of the wedge-shaped elements comprises a light exit surface being structured according to a step function.

15. The illumination system of claim 1, wherein the first and second elements comprise wedge-shaped elements with an optical crystal axis oriented in plane perpendicular to a light propagation and under 45° with respect to each other.

16. The illumination system of claim 1, wherein the arrangement comprises a plurality of plane-parallel sections or blocks, and at least some of the blocks have a different thickness measured in a light propagation direction.

17. The illumination system of claim 13, wherein the plurality of plane-parallel sections or blocks are monolithic.

18. The illumination system of claim 1, wherein the first and second elements comprise plane-parallel elements.

19. The illumination system of claim 1, further comprising a control device configured to move the first and second elements relative to each other.

20. The illumination system of claim 1, wherein the illumination system is configured so that respective positions of the first and second elements are adjustable to compensate retardation produced by the optical components of the illumination system and/or birefringence introduced in the illumination system by a mask.

21. A method, comprising:
providing the illumination system of claim 1; and
adjusting respective positions of the first and second elements to compensate retardations produced by optical components of the illumination system and/or birefringence introduced in the system by a mask.

22. An apparatus, comprising:
an illumination system according to claim 1; and
a projection objective,
wherein the apparatus is a microlithographic projection exposure apparatus.

23. A method of using a microlithographic projection exposure apparatus comprising an illumination system and a projection objective, the method comprising:
using the illumination system to illuminate at least part of structures of a mask; and
using the projection objective to image at least part of the illuminated structures of the mask onto a light-sensitive material,
wherein the illumination system is an illumination system according to claim 1.

* * * * *

UNITED STATES PATENT AND TRADEMARK OFFICE
CERTIFICATE OF CORRECTION

PATENT NO. : 10,151,982 B2
APPLICATION NO. : 15/008731
DATED : December 11, 2018
INVENTOR(S) : Damian Fiolka, Daniel Walldorf and Ingo Saenger Page 1 of 1

It is certified that error appears in the above-identified patent and that said Letters Patent is hereby corrected as shown below:

On the Title Page

Column 1, (71) Applicant:, Line 1, delete "Oberhocken" insert -- Oberkochen --.

In the Specification

Column 13, Line 25, delete "arrangement." and insert -- arrangement, --.

Signed and Sealed this
Seventh Day of May, 2019

Andrei Iancu
*Director of the United States Patent and Trademark Office*